(12) United States Patent
Wang et al.

(10) Patent No.: US 11,803,381 B2
(45) Date of Patent: Oct. 31, 2023

(54) INSTRUCTION SIMULATION DEVICE AND METHOD THEREOF

(71) Applicant: Shanghai Zhaoxin Semiconductor Co., Ltd., Shanghai (CN)

(72) Inventors: Weilin Wang, Beijing (CN); Yingbing Guan, Shanghai (CN); Mengchen Yang, Beijing (CN)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 17/471,167

(22) Filed: Sep. 10, 2021

(65) Prior Publication Data
US 2022/0206806 A1 Jun. 30, 2022

(30) Foreign Application Priority Data

Dec. 29, 2020 (CN) .......................... 202011588885.3
Dec. 29, 2020 (CN) .......................... 202011588921.6

(51) Int. Cl.
*G06F 9/30* (2018.01)
*G06F 9/38* (2018.01)
(Continued)

(52) U.S. Cl.
CPC ........ *G06F 9/30145* (2013.01); *G06F 9/3017* (2013.01); *G06F 9/30047* (2013.01); *G06F 9/30101* (2013.01); *G06F 9/30174* (2013.01); *G06F 9/30185* (2013.01); *G06F 9/30189* (2013.01); *G06F 9/3814* (2013.01); *G06F 9/3857* (2013.01); *G06F 9/455* (2013.01); *G06F 9/45516* (2013.01); *G06F 9/4812* (2013.01); *G06F 11/0772* (2013.01)

(58) Field of Classification Search
CPC ............... G06F 9/30145; G06F 9/3017–30178
See application file for complete search history.

(56) References Cited

U.S. PATENT DOCUMENTS 4,839,797 A 6/1989 Katori et al.
4,873,629 A 10/1989 Harris et al.
(Continued)

OTHER PUBLICATIONS

"Office Action of Related U.S. Appl. No. 17/471,423", dated Oct. 5, 2022, pp. 1-20.
(Continued)

*Primary Examiner* — Jyoti Mehta
(74) *Attorney, Agent, or Firm* — JCIPRNET

(57) ABSTRACT

An instruction simulation device and a method thereof are provided. The simulation device includes a monitor, which is configured to determine whether a ready-for-execution instruction is an instruction under a new/extended instruction set sharing the same instruction set architecture as that of the processor. If the ready-for-execution instruction is an extended instruction, it is converted into a simulation program which consists of a compatible instruction sequence further composed of at least one native instruction of the processor or a compatible instruction recognizable/executable by the processor. An execution result of the extended instruction is simulated by executing the simulation program, thereby extending the service life of an electronic appliance embodied with the disclosed simulation device therein.

36 Claims, 13 Drawing Sheets

(51) Int. Cl.
*G06F 9/48* (2006.01)
*G06F 11/07* (2006.01)
*G06F 9/455* (2018.01)

(56) References Cited

U.S. PATENT DOCUMENTS

| | | | |
|---|---|---|---|
| 5,630,052 | A | 5/1997 | Shah |
| 5,701,442 | A | 12/1997 | Ronen |
| 5,781,750 | A | 7/1998 | Blomgren et al. |
| 5,794,063 | A | 8/1998 | Favor |
| 5,838,987 | A | 11/1998 | Brightman et al. |
| 5,881,258 | A | 3/1999 | Arya |
| 5,896,519 | A | 4/1999 | Worrell |
| 5,909,567 | A | 6/1999 | Novak et al. |
| 5,983,337 | A | 11/1999 | Mahalingaiah et al. |
| 6,093,213 | A | 7/2000 | Favor et al. |
| 6,496,922 | B1 | 12/2002 | Borrill |
| 6,711,667 | B1 | 3/2004 | Ireton |
| 6,928,536 | B2 | 8/2005 | Duesterwald et al. |
| 7,831,807 | B1 | 11/2010 | Johnson et al. |
| 9,442,794 | B1 | 9/2016 | Tian |
| 9,563,424 | B2 | 2/2017 | Sehr et al. |
| 9,594,927 | B2 | 3/2017 | Zimmer et al. |
| 2001/0010072 | A1 | 7/2001 | Yoshida |
| 2003/0221035 | A1* | 11/2003 | Adams ............... G06F 9/45541 710/301 |
| 2004/0111717 | A1 | 6/2004 | Abdulhayoglu |
| 2008/0216073 | A1 | 9/2008 | Yates et al. |
| 2008/0282241 | A1 | 11/2008 | Dong |
| 2009/0158015 | A1 | 6/2009 | Hillman et al. |
| 2009/0204785 | A1 | 8/2009 | Yates, Jr. et al. |
| 2009/0222654 | A1* | 9/2009 | Hum ..................... G06F 9/5094 713/323 |
| 2010/0058034 | A1 | 3/2010 | Zaks |
| 2010/0192137 | A1 | 7/2010 | Inglis et al. |
| 2011/0093627 | A1 | 4/2011 | De et al. |
| 2012/0260042 | A1 | 10/2012 | Henry et al. |
| 2013/0246768 | A1* | 9/2013 | Gschwind ........... G06F 9/30181 712/E9.023 |
| 2013/0305013 | A1 | 11/2013 | Ebersole |
| 2014/0129808 | A1 | 5/2014 | Naveh et al. |
| 2014/0281399 | A1 | 9/2014 | Rash et al. |
| 2014/0304493 | A1 | 10/2014 | Zhong et al. |
| 2015/0356297 | A1 | 12/2015 | Guri et al. |
| 2016/0026482 | A1 | 1/2016 | Abdallah |
| 2016/0026486 | A1 | 1/2016 | Abdallah |
| 2016/0070932 | A1 | 3/2016 | Zimmer et al. |
| 2016/0092236 | A1 | 3/2016 | Kanapathipaillai et al. |
| 2017/0134347 | A1 | 5/2017 | Kupreev et al. |
| 2018/0159747 | A1 | 6/2018 | Chang et al. |
| 2018/0322313 | A1 | 11/2018 | Yao et al. |
| 2019/0034316 | A1 | 1/2019 | Levit-Gurevich et al. |
| 2019/0043159 | A1 | 2/2019 | Levit-Gurevich et al. |
| 2019/0220279 | A1* | 7/2019 | Mcneeney .......... G06F 9/30043 |
| 2019/0391904 | A1 | 12/2019 | Sabharwal et al. |
| 2020/0073643 | A1 | 3/2020 | Tsirkin |
| 2020/0082491 | A1 | 3/2020 | Harris |
| 2021/0117251 | A1 | 4/2021 | Cristofi et al. |
| 2021/0182724 | A1 | 6/2021 | Zou et al. |
| 2021/0397425 | A1 | 12/2021 | Zwarich et al. |
| 2022/0066933 | A1 | 3/2022 | Kamand |
| 2022/0100527 | A1 | 3/2022 | Viste et al. |
| 2022/0197678 | A1 | 6/2022 | Poornachandran et al. |
| 2022/0206794 | A1 | 6/2022 | Wang et al. |
| 2022/0206808 | A1 | 6/2022 | Wang et al. |
| 2022/0206810 | A1 | 6/2022 | Wang et al. |
| 2022/0206812 | A1 | 6/2022 | Wang et al. |
| 2022/0206813 | A1 | 6/2022 | Wang et al. |
| 2022/0206815 | A1 | 6/2022 | Wang et al. |
| 2023/0221957 | A1 | 7/2023 | Pool et al. |

OTHER PUBLICATIONS

"Office Action of Related U.S. Appl. No. 17/471,343", dated Jun. 27, 2022, p. 1-p. 9.
"Notice of allowance of Related U.S. Appl. No. 17/471,387", dated Jul. 11, 2022, p. 1-p. 9.
"Office Action of Related U.S. Appl. No. 17/471,440", dated Sep. 21, 2022, p. 1-p. 12.
"Office Action of Related U.S. Appl. No. 17/471,359", dated Dec. 21, 2022, pp. 1-29.
"Office Action of Related U.S. Appl. No. 17/471,170", dated Dec. 1, 2022, p. 1-p. 36.
"Notice of allowance of Related U.S. Appl. No. 17/471,400", dated Oct. 19, 2022, pp. 1-21.
"Office Action of Related U.S. Appl. No. 17/471,170", dated Mar. 16, 2023, p. 1-p. 23.
"Office Action of Related U.S. Appl. No. 17/471,423", dated Apr. 13, 2023, p. 1-p. 10.
"Office Action of Related U.S. Appl. No. 17/471,454", dated Apr. 18, 2023, p. 1-p. 24.
"Office Action of Related U.S. Appl. No. 17/471,371", dated Jan. 26, 2023, p. 1-p. 46.
"Office Action of Related U.S. Appl. No. 17/471,454", dated Jan. 19, 2023, p. 1-p. 46.
"Office Action of U.S. Related Application, U.S. Appl. No. 17/471,371", dated Jul. 18, 2023, p. 1-p. 13.
"Notice of allowance of U.S. Related Application, U.S. Appl. No. 17/471,454", dated Jun. 22, 2023, p. 1-p. 17.
"Notice of allowance of U.S. Related Application, U.S. Appl. No. 17/471,423", dated Jul. 25, 2023, p. 1-p. 17.

* cited by examiner

```
emulate_addsd_512(InstInfo *inst, ProcessorContext *ctx, ProcessStatus *status, DedicateHW *dhw)
{
    round_mode_t rc = RC_NONE;
    u8 tmp_result[512] = {0,};
    u8 src1[512] = {0,};
    u8 src2[512] = {0,};
    if (emulate_reg(dhw, inst->dst)) {
        tmp_result[512] = read_reg(dhw, inst->dst, inst->max_vl);  // read from dedicateHW mapping
    }
    else {
        tmp_result[512] = read_reg(ctx, inst->dst, inst->max_vl);
    } if (emulate_reg(dhw, inst->src1)) {
        src1[512] = read_reg(dhw, inst->src1, inst->max_vl);
    }
    else {
        src1[512] = read_reg(ctx, inst->src1, inst->max_vl);
    }
    if (emulate_reg(dhw, inst->src2)) {
        src2[512] = read_reg(dhw, inst->src2, inst->max_vl);
    }
    else {
        src2[512] = read_reg(ctx, inst->src2, inst->max_vl);
    }
```

FIG. 6A

```
if (inst->evex.b == 1 && is_reg(inst->src2)) {
    rc = inst->evex.rc;
}
else {
    rc = ctx[mxcsr].rm;
} if ( ! has_kmask(inst) || inst->kmask[1][0]) {
    // do add operation
    tmp_result[63:0] = src1[63:0] + src2[63:0];
    // perform round routine
    tmp_result[63:0] = round(tmp_result[63:0], rc);
}
else {
    if (has_mergeflag(inst)) {
        // no change on tmp_result[63:0]
    }
    if (has_zeroflag(inst)) {
        tmp_result[63:0] = 0;
    }
}
tmp_result[127:64] = src1[127:64];
tmp_result[inst->max_vl:128] = 0;
```

FIG. 6B

```
if (emulate_reg(dhw, inst->dst)) {
    save_result(dhw, tmp_result, inst->dst, inst->max_vl);
}
else {
    save_result(ctx, tmp_result, inst->dst, inst->max_vl);
} if (inst->max_vl > predefine.MAX_VL_SUPPORT_BY_HW) {
    update_vecreg(tmp_result, inst->dst, predefine.MAX_VL_SUPPORT_BY_HW);
} return ;
}
```

FIG. 6C

INSTRUCTION SIMULATION DEVICE AND METHOD THEREOF

CROSS-REFERENCE TO RELATED APPLICATION

This application claims the priority benefit of China application serial no. 202011588921.6, filed on Dec. 29, 2020, and China application serial no. 202011588885.3, filed on Dec. 29, 2020. The entirety of each of the above-mentioned patent applications is hereby incorporated by reference herein and made a part of this specification.

BACKGROUND

Technical Field

The disclosure relates to an instruction execution of a computer device, and in particular to an instruction simulation device and a method thereof.

Description of Related Art

With continuous developments in computer systems, processor manufacturers may upgrade their instruction sets of those instruction set architectures (ISAs) supported by their processors. A processor may thus incompletely support a new, updated, or an extended instruction set sharing the same ISA currently supported by itself, such that an instruction under new/updated instruction sets may be executed inaccurately and thus cause executional errors. In other words, those instructions which a processor may support are determinate after manufacture such that any new-added extended instruction may be incorrectly executed over an old-version processor. The incompatibility among processor instruction sets and their updated versions is still an outstanding issue up-to-date.

Therefore, an old-version processor and/or the computer system embodied with it may be thrown away if this old-version is unable to support an updated version of its current instruction set, which is obvious a resource-wasting as well as a life-shortening approach for the uses of those electronic appliances embodied with old-version processors therein.

SUMMARY

The disclosure provides an instruction simulation device and a method thereof, configured to overcome the incompatibility issue among processor instruction sets, thereby extending the service life of an electronic appliance embodied with the disclosed simulation device therein.

The simulation device of the disclosure includes a monitor, which is configured to determine whether a ready-for-execution instruction that a processor is going to execute currently is a compatible instruction or an extended instruction, wherein the extended instruction is under a new/extended instruction set in comparison with that of the processor but shares the same ISA as that of the processor. If the ready-for-execution instruction is determined as an extended instruction, this ready-for-execution instruction is then converted into a simulation program consisting of a compatible instruction sequence that is constructed by at least one native/compatible instruction recognized by the processor. Associated execution result of the ready-for-execution instruction is simulated by executing the simulation program.

A conversion method of the disclosure includes the following steps. A ready-for-execution instruction is determined as a compatible instruction or an extended instruction, wherein the extended instruction is under a new/extended instruction set in comparison with that of the processor but shares the same ISA with that of the processor. If the ready-for-execution instruction is an extended instruction, this ready-for-execution instruction is converted into a simulation program constructed by a compatible instruction sequence, and the execution result of the ready-for-execution instruction is simulated by referring that of the simulation program.

Based on the above, the simulation device and the method thereof described in the embodiments of the disclosure use a monitor to determine whether the ready-for-execution instruction associated with an application program is a compatible instruction or an extended instruction for the processor. When the ready-for-execution instruction is determined as an extended instruction, the ready-for-execution instruction is converted into a simulation program constructed by a compatible instruction sequence, and the simulation program is then executed to simulate the execution result of the ready-for-execution instruction. Therefore, by introducing little modifications to processor hardware structure, the disclosure is able to correctly execute an extended instruction under the new/extended instruction set over an old-version processor, so as to eliminate the conventional compatibility issue among processor instruction sets as well as to extend the service lives of those electronic appliances having the disclosed simulation device therein.

BRIEF DESCRIPTION OF THE DRAWINGS

FIGS. 6A, 6B and 6C collaboratively demonstrate an exemplary simulation program according to an embodiment of the disclosure.

DESCRIPTION OF THE EMBODIMENTS

Figure 1:
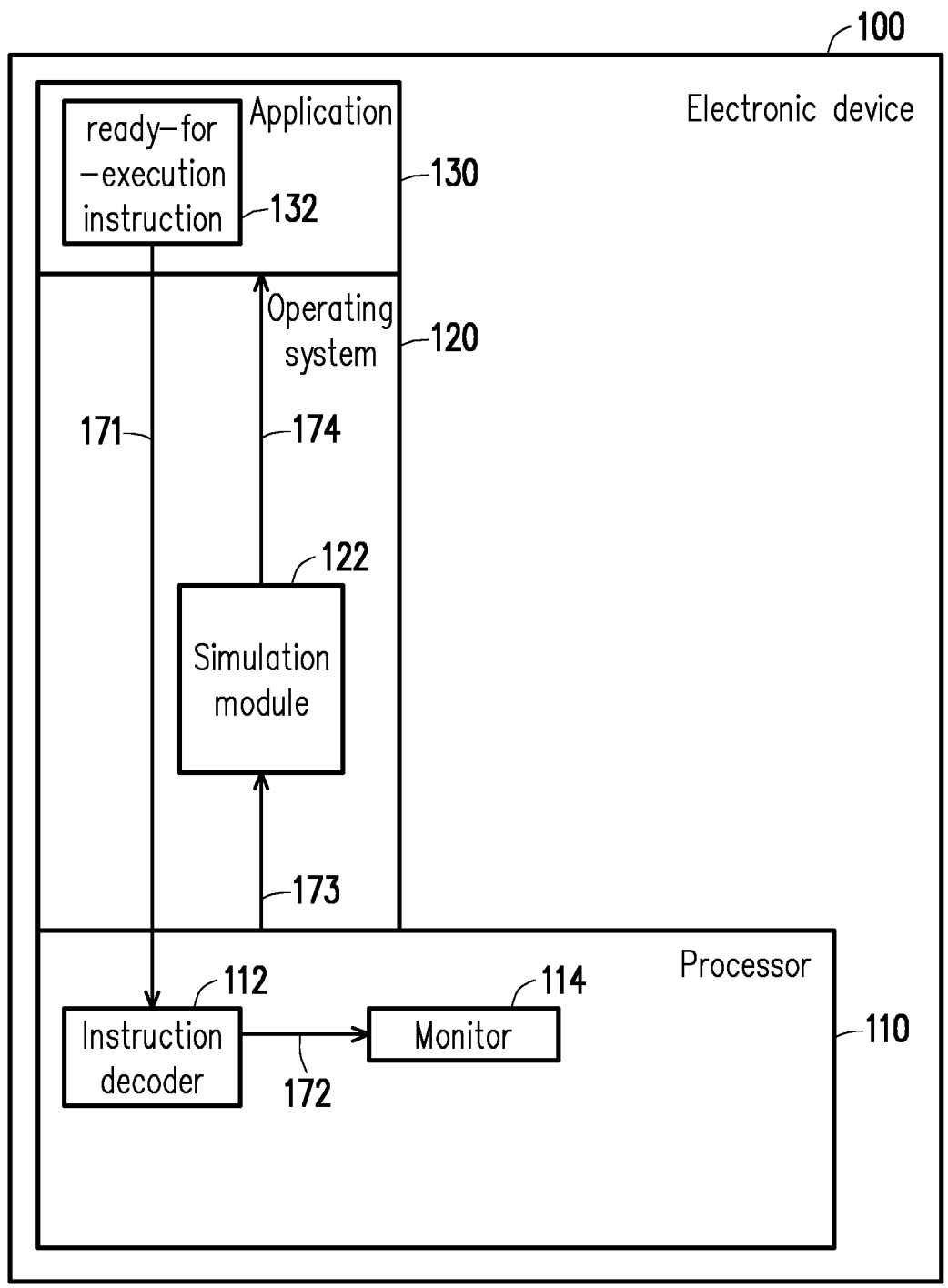
FIG. 1 is a schematic diagram of an electronic device embodied with an instruction simulation device according to an embodiment of the disclosure.

Some terminologies and technical terms herein are used to describe embodiments of the specification only and should not be constructed as any limitation to the present invention:

Compatible instruction: a compatible instruction is an instruction that is a native instruction of a certain series/model of processors, or an instruction that may be recognized/interpreted as at least one native instructions, and therefore may be implemented accurately by the processors.

Incompatible instruction: an incompatible instruction refers to at least one of the three types of instructions: (a). an instruction which is under a new/extension instruction set in comparison with that of a certain series/model of a processor but shares the same ISA with that of this processor such that such an instruction may be inaccurately recognized/interpreted by the processor, (b). an incorrect/invalid instruction, or (c). an instruction that is classified as a different ISA from that of the processor.

Extended instruction: an extended instruction is an instruction under a new/extended instruction set in comparison with that of a certain series/model of processor but shares the same ISA as that of this processor, such that an extended instruction may be inaccurately recognized/interpreted by the processor and may raises an incompatible issue. For example, an instruction in AVX/AVX-512 (for example, VADDSD or VADDPD) is an extended instruction for a Pentium M processor. An extended instruction is also the type (a) of the incompatible instruction aforementioned.

Untranslatable instruction: an untranslatable instruction refers to one of the two types of instructions: (a). an incorrect/invalid instruction of the aforementioned incompatible instruction or (b). an instruction that shares a different ISA from that of the processor (for example, any instruction in an ARM/RISC ISA is an instruction sharing different ISA from that of a X86 processor). An untranslatable instruction may be type (b) or (c) of the aforementioned incompatible instruction.

Compatible instruction sequence: a compatible instruction sequence is an instruction sequence composed of at least one native/compatible instructions of a processor. An execution result of the compatible instruction sequence is the same as that of an associated extended instruction.

Simulation program: a simulation program is a program encompasses an aforementioned compatible instruction sequence composed of at least one native/compatible instructions of a processor as well as required definitions of data structures, variables, parameters or the like, . . . etc., and the simulation program may be performed by the processor to simulate an execution result of associated extended instruction.

Real-time simulation mode: a real-time simulation mode refers to those operations of recognizing a ready-for-execution instruction which is going to be executed by a processor currently is an extended instruction or not, and of translating and performing a simulating program associated with the recognized extended instruction to generate an execution result for simulating that of the ready-for-execution instruction. An application program arising this ready-for-execution instruction to the processor for executions is unconscious of the existence of the real-time simulation mode.

It is to be noted that the aforementioned compatible instruction, the incompatible instruction, the extended instruction, the untranslatable instruction, the compatible instruction sequence, and the simulation program are all related to a certain series or model of processors. Specifically, the processors may be, but no limit to, those Reduced Instruction Set Computing (RISC) processors supporting an ARM Cortex series instruction sets, Complex Instruction Set Computing (CISC) processors supporting X86 instruction sets developed by Intel/AMD, Microprocessor without Interlocked Pipeline Stages (MIPS) processors, processors supporting RISC-V (RISC-Five) ISA, processors supporting both the ARM and X86 ISAs, or processors equipped with an ISA other than RISC/CISC. The disclosure does not specifically limit any ISA type supported by the processor. Those skilled in the art should understand that an integrated circuit manufacturer may define/implement their own microarchitectures under the ISA supported by their processors according to their needs, and the disclosure is not limited in this respect.

Regarding those terminologies defined above, those skilled in the art may define different technical terms with respect to the technical ideas of the disclosure by themselves. Those terminologies defined aforementioned should be understood from the perspectives of technical-function implementations and should not be distinguished by the wording thereof. The disclosure is not limited thereto. Those skilled in the art should understand that an integrated circuit manufacturer may use different terms to define a specific concept and/or refer to a specific component. The specification and claims do not distinguish a technical term by means of the difference in wording only, but distinguish it based on the difference in its technical function. The terms "including" and "such as" mentioned in the entire specification and claims are open-ended terms, so they should be interpreted as "including but not limited to." In addition, the term "coupled" in the specification includes any direct and indirect electrical connection approaches. Therefore, if a first device is coupled to a second device described in the specification, it means that the first device may be electrically connected to the second device directly, or indirectly electrically connected to the second device over other devices or connection manners. Those skilled in the art should know that those variations described above do not depart from the spirits of the disclosure should be included in the appended claims.

FIG. 1 is a schematic diagram of an electronic device 100 according to an embodiment of the disclosure, wherein a simulation device is operated within the processor embodied in the electronic device 100. The electronic device 100 is, for example, a consumer electronic device, such as a tablet computer, a smart phone, a computer, a server, etc.

Referring to FIG. 1, the electronic device 100 encompasses a processor 110 configured to perform an operating system 120 and an application program 130 thereon and the operating system 120 executing on the processor 110 manages the operations of the application program 130 performed thereon. The application program 130 running on the operating system 120 uses various functions provided by the processor 110 and other hardware (not shown in FIG. 1, for example, a hard disk, a network interface card, etc.) with the assistances of the operating system 120. When the electronic device 100 is turned on, a basic input/output system (BIOS) may be used for self-testing and initialization, while the operating system 120 and device drivers associated hardware components are subsequently performed by means of the processor 110. The application program 130 is composed of multiple instructions, which are executed by the processor 110 to implement those functions defined by the application program 130. Specifically, when a ready-for-execution instruction 132 derived from the application program 130 is read from a storage medium (e.g., a hard disk, not shown) and stored in a dynamic random access memory (for example, a system memory, not shown) of the electronic device 100, the processor 110 executes the ready-for-execution instruction 132 in program order. When the processor 110 is to execute the ready-for-execution instruction 132, an instruction decoder 112 interprets the ready-for-execution instruction 132 to generate associated format information (for example, the instruction is divided into lots of fields indicating different operations, definitions, the way of accessing operands, . . . etc.) and subsequently decodes the ready-for-execution instruction 132 according to the generated format information. On the other hand, a monitor 114 determines whether the ready-for-execution instruction 132 is a compatible instruction (for example, a native instruction or an instruction recognizable for the processor 110) or an extended instruction (forwarding to the monitor 114 along an arrow 172 shown in FIG. 1 for determinations) according to the format information generated by the instruction decoder 112. If the ready-for-execution instruction 132 is a native/compatible instruction, the processor 110 executes the ready-for-execution instruction 132 and returns an execution result (not shown in the drawing) to the application program 130. The execution operation of a native/compatible instruction is well-known by those skilled in the art and will not be described in the specification in details. On the other hand, when the monitor 114 determines the ready-for-execution instruction 132 currently executed by the processor 110 as one of extended instructions, this ready-for-execution instruction 132 is regarded as parameters for invoking the simulation module 122 (along an arrow 173 shown in FIG. 1). The simulation module 122 converts the ready-for-execution instruction 132 (currently an extended instruction) into a simulation program including a compatible instruction sequence, then executes the simulation program to generate an execution result, and finally returns associated execution result of the simulation program to the application program 130 (along an arrow 174 shown in FIG. 1) to simulate the implementations of the extended instruction. On the other hand, when the instruction decoder 112 fails to recognize and interpret the ready-for-execution instruction 132 executed by the processor 110 currently, this ready-for-execution instruction 132 is then determined as an untranslatable instruction by the monitor 114, and the processor 110 reports an executional error or an exception (not shown in the drawing) to the application program 130. The manipulation processes of the untranslatable instruction are not shown herein because they are well-known by those skilled persons. After the simulation module 122 is called, the simulation module 122 reads the ready-for-execution instruction 132 (currently being determined as an extended instruction as aforementioned), and determines whether a simulation program corresponding to this extended instruction is found. The simulation module 122 may search a simulation program table to find the one corresponding to the extended instruction. The simulation program table consists of lots of simulation programs (which are respectively made up of associated compatible instruction sequences as aforementioned), which are programmed and prepared by processor designers according to associated implementations of extended instructions in advance. The simulation program table may be indexed by means of extended instructions or may be realized through a database such that the simulation module 122 may search and find requested one therefrom. When the simulation program corresponding to the extended instruction is in the simulation program table, the simulation module 122 retrieves and subsequently executes the simulation program to generate and return a simulation execution result to the application program 130, and finally terminates the calls to the simulation module 112. On the other hand, if the simulation module 122 fails to find the simulation program corresponding to the extended instruction from the simulation program table, the simulation module 122 returns a failure result to the processor 110 and terminates the calling process. It is to be noted that the simulation module 122 is called when the processor 110 executes the ready-for-execution instruction 132 derived from the application program 130 is determined as an extended instruction, and the simulation module 122 terminates operations after associated simulation execution result of the simulation program corresponding to the extended instruction has been generated and returned. Therefore, the application program 130 does not perceive the operations regarding the extended instruction conversions as well as the simulation program implementations performed by the simulation module 122 (the real-time simulation mode is turned on during the entire operating period of the simulation module 122 and turned off the rest of the time), such that all operations of the simulation module 122 are transparent to the application program 130. Operations that the simulation module 122 calls and executes the simulation program will be described in more detail later.

The processor 110 in FIG. 1 may be a single-core or multiple-core central processing unit (CPU), a microprocessor, a programmable processing unit, a digital signal processor (DSP), a programmable controller, an application specific integrated circuit (ASIC), a programmable logic device (PLD), or other similar devices. In addition, the ready-for-execution instruction 132 corresponding to the application program 130 is derived from source codes written by application developers by using a middle-/high-level programming-language platform (such as C language/C++ language/C # language, Java language, Python language . . . etc.) and/or low-level programming-language platform (such as assembly language). A compiler then compiles those source codes to generate associated executable codes for the implementations over the processor 110 (such as machine codes or binary codes). Therefore, as shown in FIG. 1, the ready-for-execution instruction 132 forwarding to the processor 110 via the arrow 171 is a machine code or an instruction recognizable for the processor 110, which is generated through associated compiling/linking processes performed on a program written by programming-language platform. Those skilled in the art should understand that, for the sake descriptions, the ready-for-execution instruction 132 is a machine instruction that is recognizable and executable for the processor 110. The disclosure does not repeatedly distinguish a machine instruction such as the ready-for-execution instruction 132 from any instruction written by a middle/high-level program language hereinafter.

The monitor 114 in FIG. 1 is disposed inside the processor 110 to determine whether a ready-for-execution instruction 132 is a compatible instruction or an extended instruction. However, those skilled persons may employ any circuit structure or any firmware/software program to realize the determinations of the monitor 114. For example, the monitor 114 supporting a new-version instruction set may be established by updating the device driver of an old-version processor without any hardware similar to the monitor 114 therein. Originally, this old-version processor can neither interpret instructions under the new-version instruction set nor call the simulation module 122 to support those operations such as translating the extended instruction into associated simulation program and then executing the simulation program having associated compatible instruction sequence to generate required simulation result. However, if the functions of monitor 114 are implemented by program codes and complied as a portion of a device driver, when the old-version processor causes an invalid opcode exception (for example, #UD), the monitor 114 software, which may become a callback function of the operating system 120, is invoked by using a system call raised from an interrupt service program corresponding to #UD. And, when the monitor 114 software determines that the current ready-for-execution instruction 132 (causing this invalid opcode exception) is an extended instruction and thus needs aforementioned conversion assistances, the simulation module 122 (which may be programmed and updated accompanied with the monitor 114 software) is subsequently invoked to search and execute associated simulation program corresponding to this extended instruction, and finally return an execution result of this searched simulation program for simulating implementations of the current ready-for-execution instruction 132. In one embodiment, a driver that includes the monitor 114 program codes as well as the simulation module 122 may be carried out by live updates. The processor 110 designer may use native instructions of the old-version processors to program associated simulation programs corresponding to extended instructions, and then inform users of live-updating the drivers of their old-version processors to possess the capabilities of supporting the new/updated instruction sets. In sum, any independent module, software program, hardware unit, or implementation integrated with software/hardware, . . . etc., should be considered as variations of the monitor 114 for the determinations of whether a ready-for-execution instruction 132 is a compatible instruction or an extended instruction. The disclosure is not limited in this respect.

In an embodiment, after the electronic device 100 turns on, the operating system 120 then turns on the functions provided by a real-time simulation mode and allocates various store regions in the storage devices of the electronic device 100 to store processor statuses (e.g., for the uses of context switch) and associated information generated during conversion/simulation execution processes. In other words, when the ready-for-execution instruction 132 which is going to be executed by the processor 110 is determined by the monitor 114 as an extended instruction, the simulation module 122 may be called to convert the extended instruction and execute the simulation program relative to the extended instruction to generate required execution result by using those allocated store regions. In one embodiment, those skilled in the art may design the timing as well as determination conditions of turning on the real-time conversion mode to call the simulation module 122 according to their application needs. For example, when the monitor 114 determines that the ready-for-execution instruction 132 is an extended instruction, a flag (e.g., an emulation flag EF, relative descriptions will be given later) may be set so as to turn on the real-time conversion mode, such that the flag status is checked before the simulation module 122 is called accordingly. In another embodiment, the application program 130 that intends to call the simulation module 122 is confirmed as an authorized one by the operating system 120 firstly. The application program 130 may access required password by means of the device driver if it passes associated authorization checks, and the simulation module 122 may be invoked after the password is verified successfully. In one embodiment, the password may be stored in the driver of the processor 110. In order to call the simulation module 122, the processor 110 may obtain this password through the processor 110 driver, while the simulation module 122 is called after the accessed password is verified successfully. In another embodiment, multiple authentication processes or at least one encryption processes applied to the password may be performed when calling the simulation module 122, so as to ensure the security of the simulation processes for the ready-for-execution instruction 132. For example, if the application program 130 tries to access associated encrypted password is authenticated by the operating system 120, the simulation module 122 is called only when the encrypted password being accessed and decrypted successfully. Advantageously, the real-time simulation mode is turned on (that is, the simulation module 122 is authorized to be invoked) only when the simulation module 122 is called for real-time simulating the ready-for-execution instruction 132. Therefore, any unauthorized user may be prevented from invading the simulation module 122, or making any unauthorized changes or alters within the simulation processes for the ready-for-execution instruction 132. It should be understood that the time of calling the simulation module 122 may be changed according to application designs, and the disclosure is not limited in this respect. Furthermore, the allocations of the corresponding store regions after the simulation module 122 is called will be described in details by referring FIGS. 2 and 4.

Based on the above descriptions, a processor 110 equipped with the X86 instruction set may be unable to support an update/new X86 instruction set as well as any extended instruction in the updated/new one, since its X86 instruction set and hardware is determinate after manufacture. The processor 110 may inaccurately recognize and execute an extended instruction due to the limitations of its hardware structure even the extended instruction is an X86-ISA-related instruction. Therefore, the embodiment of the disclosure uses the monitor 114 of the simulation device to firstly determine whether the instruction (that is, the ready-for-execution instruction 132) that is going to be executed is a compatible instruction of the X86 instruction set inside the processor 110 or an extended instruction under an updated/new X86 instruction set, and then continues subsequently processing according to the determination. Therefore, in the embodiment of the disclosure, if the ready-for-execution instruction 132 executed by the X86 processor 110 is an X86-extended instruction of the X86 new/updated instruction set, the X86 processor 110 of the embodiment converts the ready-for-execution instruction 132 into a simulation program consisting of the X86 compatible instructions under the current instruction set of the X86 processor 110. Subsequently, the simulation module 122 executes the simulation program to simulate the execution result of the ready-for-execution instruction 132, and finally returns the execution result to the application program 130. Therefore, with the assistances of the simulation module 122, in the embodiment of the disclosure, the processor 110 with an old-version X86 instruction set is capable of translating an extended instruction of a new/updated X86 instruction set to obtain a simulation program (as shown above, the simulation program is constructed by X86 compatible instruction sequence executable for the old-version X86 processor) and to simulate associated execution result of the ready-for-execution instruction 132 by performing the simulation program. In another embodiment, the processor 110 is a processor equipped with an ARM ISA and the ready-for-execution instruction 132 is an extended instruction under the new/updated ARM instruction set relative to the current one of the ARM processor 110, and any ARM compatible instruction sequence in the simulation program is composed of at least one native instructions or compatible instructions under the current instruction set of the ARM processor. Therefore, the execution result of the ready-for-execution instruction 132, which is an extended instruction under the new/updated ARM instruction set in comparison with that of the ARM processor, may be simulated by executing the simulation program associated with this ARM extended instruction. As described above, the ready-for-execution instruction, the compatible instruction, and the extended instruction described in this embodiment are all instructions sharing the same ISA, and are not limited to instructions of the X86 ISA (or a CISC ISA). The instructions aforementioned may be instructions of an ARM ISA (or an RISC ISA), a processor that supports a MIPS or RISC-V ISA, or other ISAs, and the disclosure is not limited by ISA types. It is to be noted that the processor 110 of the disclosure, which possesses a relatively old instruction set architecture, is capable of supporting operations indicated by instructions from a relatively new ISA. Accordingly, the service life of an electronic appliance including an old-version processor is extendable, and a processor designer may make his/her old-version processors being able to support instructions under associated new/updated instruction set with few hardware modifications only (or by driver updates aforementioned). Specifically, the objective may be achievable by introducing required hardware into the processor 110, including but not limited, the monitor 114, signal transmissions among the instruction decoder 112, and the monitor 114, etc. (which are all added based on simulation requirements), accompanied with software constructing the simulation module 122 and associated simulation program table. There is no need to modify the other circuitry structure, such as pipeline and branch predictor, etc., within the processor, which indicates a processor having the disclosed functions of the embodiments may be quickly designed.

Furthermore, in an embodiment, the simulation module 122 may be stored in the basic input/output system (BIOS) of the electronic device 100, which loads the simulation module 122 into the operating system 120 when a system mounted with the processor 110 is turned on. In another embodiment, the simulation module 122 may be encoded in the driver of the processor 110 and be loaded into a system memory after executed by the operating system 120; in yet another embodiment, the simulation module 122 may be compiled as a part of the kernel of the operating system 120 and being invoked after the operating system 120 is performed. In yet another embodiment, during the conversion operations of the simulation module 122, the operating system 120 may be notified of stopping from responding interrupts (for example, any hardware interrupt irrelevant to current simulation operations) so that the conversion operations may be performed without any interference. The skilled persons should know that those variations to the above embodiments do not depart from the spirits of the disclosure should be included in the claims of the disclosure.

Figure 2A:
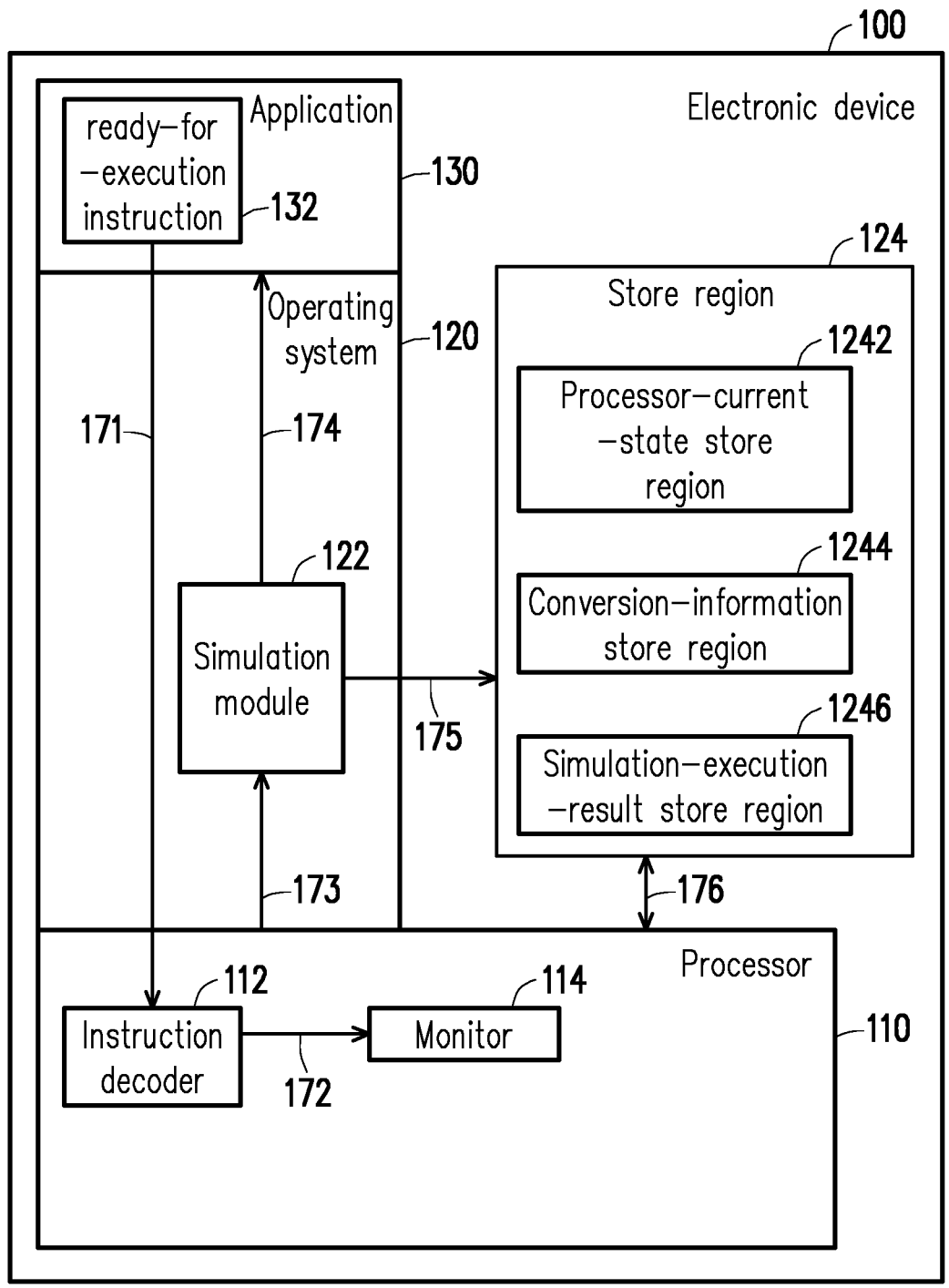
FIG. 2A is a schematic diagram of an electronic device embodied with an instruction simulation device according to another embodiment of the disclosure.

FIG. 2A is a schematic diagram of the electronic device 100 and a simulation device embodied therein according to another embodiment of the disclosure. The simulation device of electronic device 100 may further share a store region 124 in an access medium (for example, a memory) of the electronic device 100. In the store region 124, at least a processor-current-state store region 1242, a conversion-information store region 1244, and a simulation-execution-result store region 1246 are divided therefrom. The processor-current-state store region 1242 is configured to store current-context parameters of the processor 110 which are used for resuming the processor 110 back to the state before switching context, the conversion-information store region 1244 is configured to store temporary data during the operations of translating the extended instruction to obtain required simulation program (for example, temporary comparison information/results during searching required simulation program, or a pointer indicating to a simulation program in the simulation program table, etc.), and the simulation-execution-result store region 1246 is configured to store associated temporary information when the simulation program performs (for example, the storage space used for storing variables defined in the simulation program, or temporary data during executions, etc.) and generate required execution result. As shown in FIG. 2A, the simulation module 122 may temporarily store relevant state data in the store region 124 (as shown by an arrow 175), and the processor 110 may also access required execution result from the store region 124 (along the indication of the arrow 176). It is to be noted that in an embodiment, BIOS of the electric device 100 may be used to access parameters of the store region 124 as well as the processor-current-state store region 1242, the conversion-information store region 1244, the simulation-execution-result store region 1246 from associated storage medium of the electronic device 100 for the uses of configurations (for example, the size of each store region and base pointer). That is, the store region 124 may be configured other than the operating system 120, and the disclosure does not limit configuration approaches of the store region 124. The usage of the store region 124 will be described in more detail later.

Figure 2B:
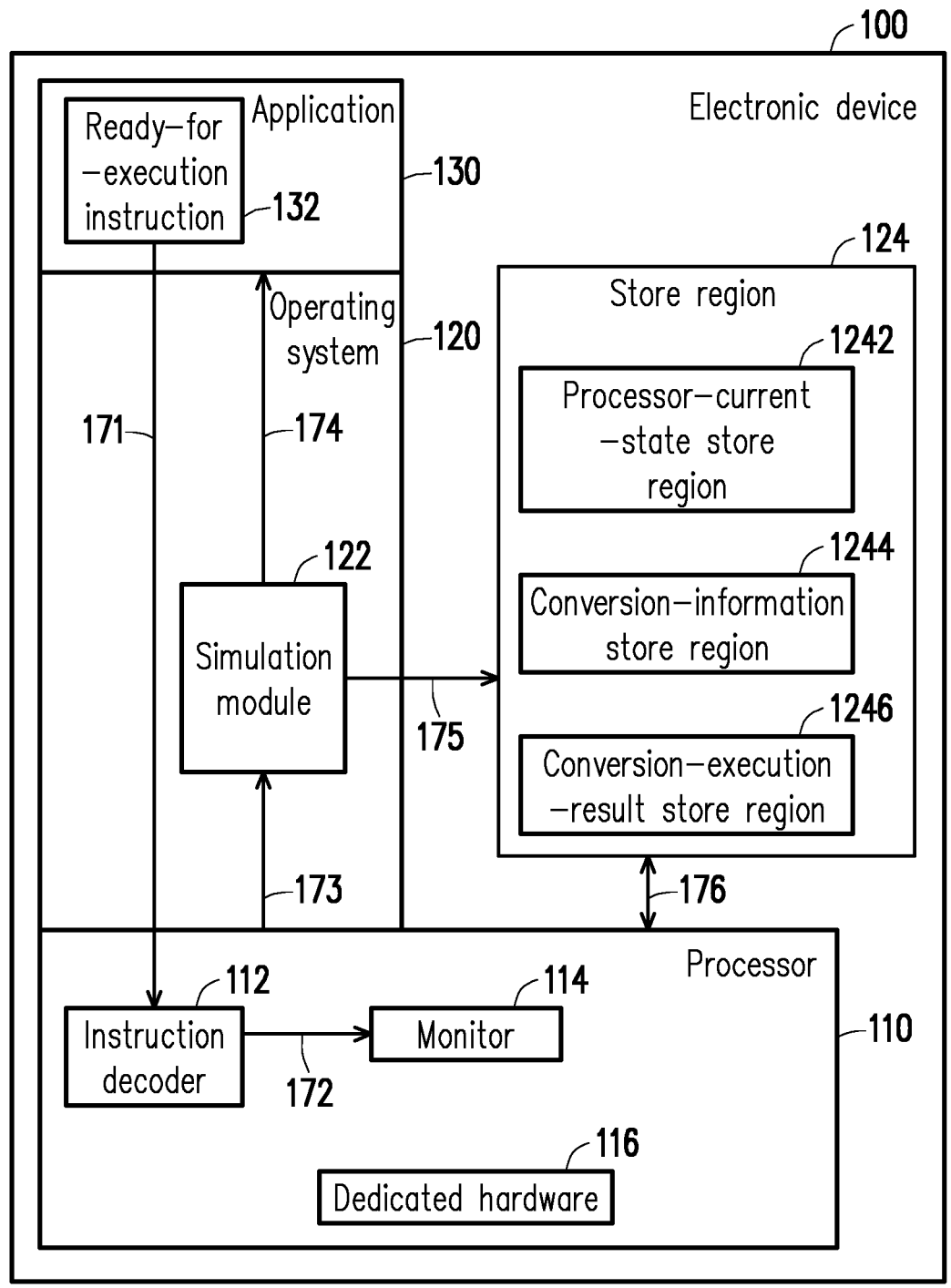
FIG. 2B is a schematic diagram of an electronic device embodied with an instruction simulation device according to yet another embodiment of the disclosure.

FIG. 2B is a schematic diagram of the electronic device 100 embodied with a simulation device therein according to yet another embodiment of the disclosure. The processor 110 of this embodiment further includes a dedicated hardware 116 which is used as a storage space dedicated to store information required by the processor 110 during the operations of translating the extended instruction into a simulation program and of executing the simulation program to generate associated simulation execution result. The usage of the dedicated hardware 116 will be described in more detail later.

Figure 3:
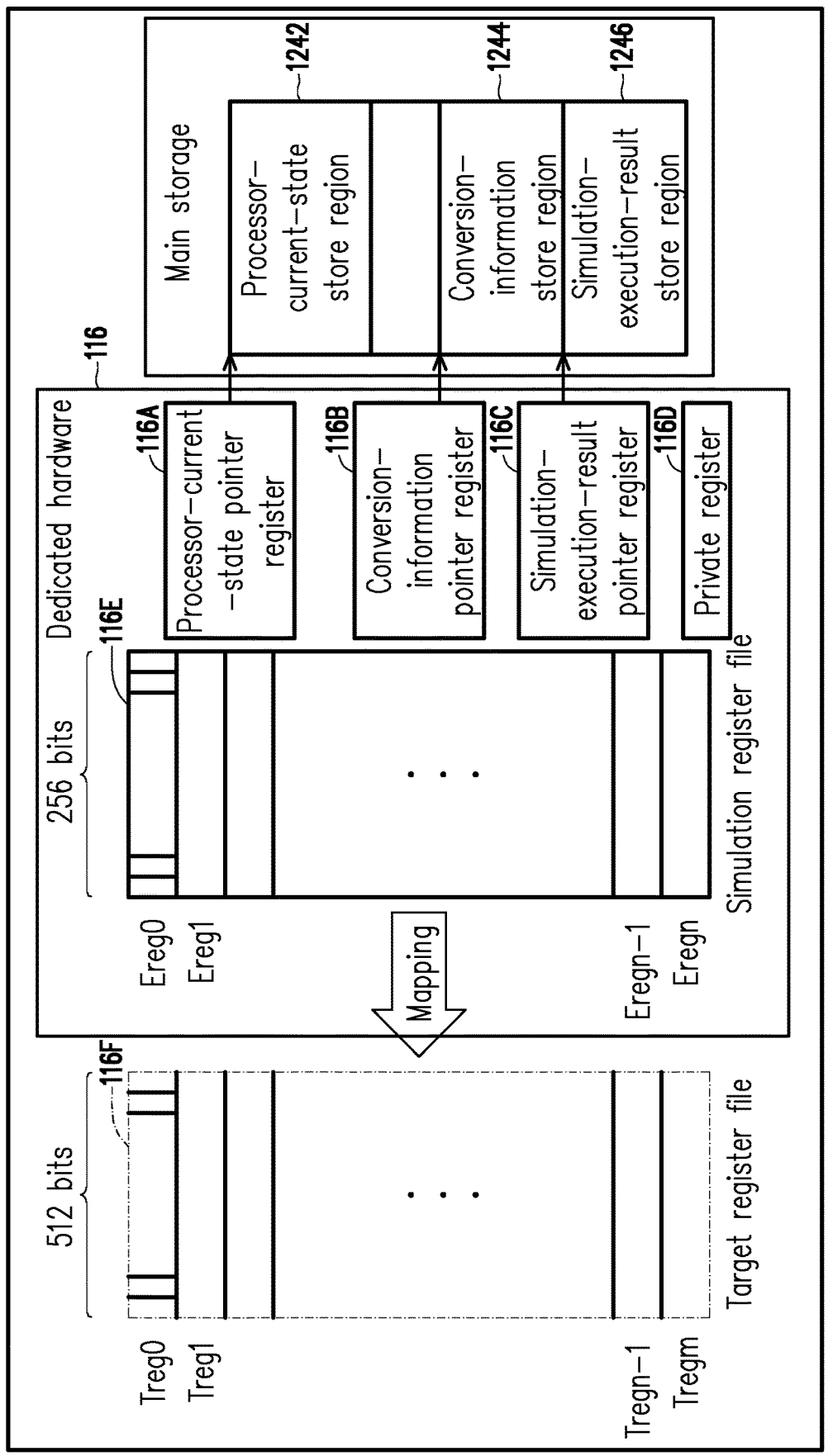
FIG. 3 is an architecture diagram of a dedicated hardware according to an embodiment of the disclosure.

FIG. 3 is an architecture diagram of the dedicated hardware 116 according to an embodiment of the disclosure. Referring to FIGS. 2A, 2B and 3 together, as shown in FIG. 3, the dedicated hardware 116 of the processor 110 includes a processor-current-state pointer register 116A, a conversion-information pointer register 116B, a simulation-execution-result pointer register 116C, a private register 116D, and a simulation register file 116E which is used for mapping an extended structural register(s) under a new/updated structure file (each of the extended structural registers is indicated by a ready-for-execution instruction (which is determined as an extended instruction) but is not supported by the current processor 110, detail descriptions about the uses of the simulation register file 116E will be given later). The processor 110 may read required state information from the store region 124 in a main storage based on associated register pointers described above. The address indicated by the processor-current-state pointer register 116A is configured to point to a storage space in the main storage for storing current-context states of the processor 110, including various register states illustrative of the current context which the processor 110 is running currently, or the instruction address next to the ready-for-execution instruction 132. The address indicated by the conversion-information pointer register 116B is configured to point to a storage space within the main storage, which is configured as a temporary storage space required by the conversion processes performed for simulating the extended instruction or configured to store intermediate information during the conversion processes, such as the format information of the extended instruction, those pointers pointing to prepared simulation programs, etc.

The address indicated by the simulation-execution-result pointer register 116C is configured to point to a storage space within the main storage, which is configured as a temporary storage space when executing the simulation program corresponding to the extended instruction, or configured to store the information generated during the executions (for example, an intermediate execution result of simulating the extended instruction, etc.) as well as the execution result of the simulation program. The private register 116D may include an emulation flag EF and a register for caching the extended instruction (neither is not shown). The emulation flag EF is configured to indicate whether a current ready-for-execution instruction 132 is a convertible/simulatable extended instruction. For instance, the current ready-for-execution instruction 132 is an extended instruction if the value thereof is set to 1, so that the simulation module 122 may be called to convert/simulate the extended instruction. On the other hand, the register, which is configured to cache the ready-for-execution instruction 132 in the private register 116D, is configured as a temporary storage space for storing the ready-for-execution instruction 132 provided as a parameter to the simulation module 122 when the simulation module 122 is called (the ready-for-execution instruction 132 at this time is determined as an extended instruction). The simulation register file 116E contains N (N is a natural number or a positive integer greater than 1) 256-bit simulation registers Ereg0, Ereg1 . . . Eregn-1, Eregn to support, for example, specific micro-operations read/write/computation of the processor 110. Exemplarily, two 256-bit registers may respectively map a high 256-bit and a low 256-bit of a 512-bit register, such that the processor 110 may use 256-bit registers in the simulation register file 116E to map and simulate an unsupported 512-bit register for the processor 110, such as Treg0, Treg1 . . . Tregn-1, Tregm (a target register file 116F) shown in the dashed lines in FIG. 3. Mapping operations between registers are well-known for those skilled in the art and will not be described in details herein. Please note that although the aforementioned 256-bit registers are used to map/simulate associated 512-bit unsupported registers, it does not mean the simulation is limited to mappings between registers with different sizes. For example, in another embodiment, the simulation register file 116E may be configured as specific registers that are not supported by current hardware of the processor 110, such as, for simulating a base address or a state control register dedicated for a specific operation mode (operating under the new/updated instruction set). On the other hand, the dedicated hardware 116, designed for the purpose of simulating an extended instruction, may be configured by designating certain registers within a register file of the processor 110 specifically, and the disclosure is not limited in this respect.

Figure 4A:
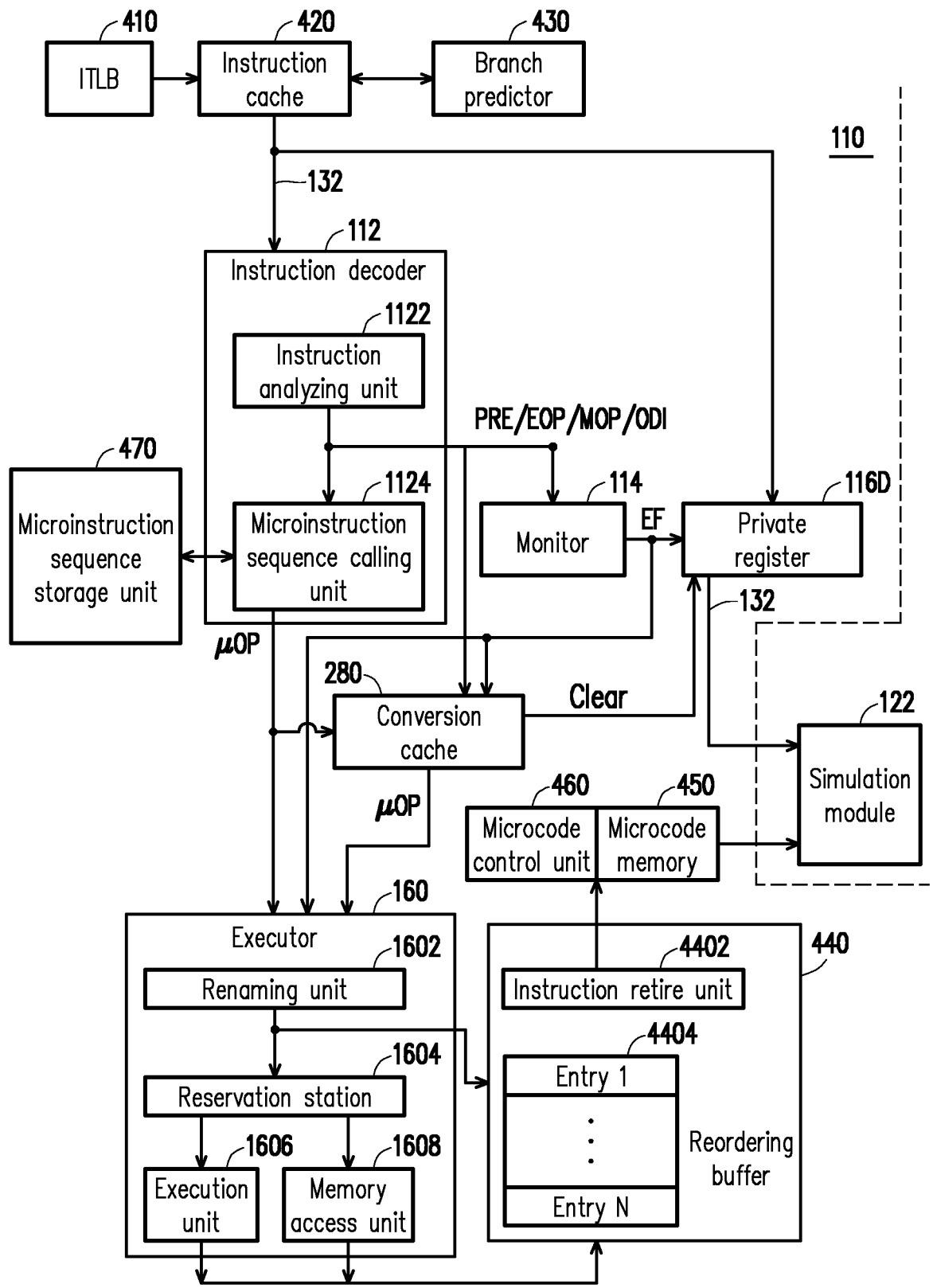
FIG. 4A is a detailed structure diagram of a processor in an electronic device according to an embodiment of the disclosure.

FIG. 4A depicts a detailed structure diagram of a processor 110 in the electronic device 100 according to an embodiment of the disclosure. In addition to the instruction decoder 112, the monitor 114, and the dedicated hardware 116 described above, the electronic device 100 further includes an instruction translation lookaside buffer ITLB 410, an instruction cache 420, a branch predictor 430, a reordering buffer 440, a microcode memory 450, a microcode control unit 460, and a microinstruction-sequence storage unit 470. The instruction translation lookaside buffer ITLB 410 may be configured to store instructions waiting for executions, such as an instruction that supports a function instructed by an application program 130 (e.g., the function indicated by the ready-for-execution instruction 132). The instruction cache 420 is configured to receive an instruction address from the ITLB 410 through a translation lookaside buffer (TLB) and then forward instruction binary to the following pipeline stages for executions. The branch predictor 430 cooperates with the instruction cache 420 that attempts to predict/guess whether an instruction causes a branch, and fetches/stores a most likely instruction to the instruction cache 420 when a branch is predicted to be taken. As described above, the private register 116D includes the emulation flag EF indicating whether the current ready-for-execution instruction 132 is an extended instruction capable of being simulated, and a storage space caching this ready-for-execution instruction 132. The usage of the emulation flag EF and the storage of the extended instruction will be described in detailed later. Furthermore, an executor 160 at least includes a renaming unit 1602, a reservation station 1604, an execution unit 1606, and a memory access unit 1608. The instruction decoder 112 further includes an instruction analyzing unit 1122 and a microinstruction-sequence calling unit 1124. The instruction analyzing unit 1122 is coupled to the microinstruction-sequence calling unit 1124 and the monitor 114 which is further coupled to the private register 116D, while the microinstruction-sequence calling unit 1124 is coupled to the microinstruction-sequence storage unit 470.

When the ready-for-execution instruction 132 is sent from the instruction cache 420 to the instruction decoder 112, the instruction analyzing unit 1122 in the instruction decoder 112 first identifies the format of the ready-for-execution instruction 132 and then separates format information, such as a prefix (PRE), an escape code (EOP), an main opcode (MOP) and other decoding information (Other Decoding Information (ODI) includes information within an extended instruction required for instruction decoding/interpretations) if this ready-for-execution instruction 132 is recognizable. Next, the format information (that is, PRE/EOP/MOP/ODI) is directed to the microinstruction-sequence calling unit 1124 and the monitor 114 at the same time. The microinstruction-sequence calling unit 1124 in the instruction decoder 112 subsequently decodes the format information to learn the operation instructed by the ready-for-execution instruction 132, and then fetches corresponding microinstruction (μop) sequence (composed of at least one microinstruction) from the microinstruction-sequence storage unit 470, incorporate the fetched microinstruction sequence with the operand information (for example, addressing information of operands) indicated by the ready-for-execution instruction 132 to generate required microinstruction(s), and finally redirects the microinstruction(s) to the executor 160 (for example, to the renaming unit 1602 therein). After associated renaming processes are performed on the microinstruction(s), the microinstruction(s) is(are) redirected to the reservation station 1604 and the reordering buffer 440 simultaneously. The reservation station 1604 issues the microinstruction(s) to an execution unit 1606 or the memory access unit 1608 for further processing according to the function indicated by the microinstruction(s). The reordering buffer 440 includes an instruction retire unit 4402 and a microinstruction buffer 4404, wherein the microinstruction buffer 4404 includes a plurality of instruction entries that are further configured to store the microinstruction(s) received from the renaming unit 1602. After the microinstruction(s) is(are) completely implemented, the execution unit 1606 or the memory access unit 1608 notifies the instruction retire unit 4402 within the reordering buffer 440 of retiring this implemented microinstruction(s) according to the original program order.

The following describes the manipulations when the ready-for-execution instruction 132 which is going to be performed by the processor 110 is determined as an extended instruction. The monitor 114 determines whether the ready-for-execution instruction 132 is an extended instruction according to the format information (PRE/EOP/MOP/ODI obtained through format analysis of the ready-for-execution instruction 132 by the instruction analyzing unit 1122), firstly. If the ready-for-execution instruction 132 is determined as an extended instruction, the emulation flag EF is then asserted and the private register 116D is instructed to store the ready-for-execution instruction 132. On the other hand, as described above, when the ready-for-execution instruction 132 is an extended instruction, a no operation (NOP) instruction is derived if the microinstruction-sequence calling unit 1124 fails to recognize the format information. Therefore, when this NOP instruction is the oldest instruction in the reordering buffer 440 waiting for retirement, the instruction retire unit 4402 checks the emulation flag EF and finds that the emulation flag EF is asserted, such that the instruction retire unit 4402 invokes associated interrupt service program of calling the simulation module 122 so as to convert and simulate implementations of the extended instruction. Operations of calling the simulation program corresponding to an extended instruction will be described later with the references of FIGS. 5A and 5B, while an exemplary simulation program is shown in FIGS. 6A, 6B and 6C. In an embodiment, the interrupt service program configured to call the simulation module 122 may be achieved by modifying the interrupt service program associated with #UD when an invalid opcode or incorrect instruction is met, or by self-defining a specialized interrupt service program by processor designers. Accordingly, when the NOP instruction that arises #UD is retired and then invoked the interrupt service program corresponding to #UD, this specified #UD-associated service program checks the status of the emulation flag EF firstly, and then issues a conversion request to the simulation module 122 through the operating system 120 when the emulation flag EF is asserted, or invokes a conventional exception service program specialized in handling the exception derived from an invalid opcode/incorrect instruction when the emulation flag EF is non-asserted. In an embodiment, the processor 110 designer may separate the conventional #UD interrupt service program and the specified #UD interrupt service program for calling the simulation module 122 as two programs, which may be called according to the status of the emulation flag EF, respectively. For example, when the emulation flag EF is not asserted, the conventional #UD interrupt service program is called, but the specialized #UD interrupt service program for calling the simulation module 122 is invoked when the emulation flag EF is asserted. In yet another embodiment, when the NOP instruction that derived #UD is retired, the retire unit 4402 first checks the emulation flag EF, and then requests the operating system 120 to call the simulation module 122 through a self-defined interrupt service program (for example, the processor 110 designer may select a reserved or non-used vector number (e.g., 20H) from the conventional interrupt vector table and defines an interrupt vector #NE (NE is the abbreviation of Non-support instruction Emulator) for this selected vector number) if the emulation flag EF is set. It is to be noted that when the interrupt service program calls the simulation module 122, the ready-for-execution instruction 132 (currently, an extended instruction) may be sent as a parameter to the simulation module 122, e.g., a register-address pointer indicating where the ready-for-execution instruction 132 is stored in the private register 116D is sent as a parameter to the simulation module 122. The simulation module 122 then converts the extended instruction, executes corresponding simulation program of this extended instruction, and finally terminates operations of calling the simulation module 122 (that is, quitting the simulation mode) after storing the execution result of the simulation program in the simulation-execution-result store region 1246. On the other hand, when the simulation execution result of the ready-for-execution instruction 132 that is determined as an extended instruction is read from the simulation module 122 by the processor 110, the emulation flag EF in the private register 116D will be clear so as to indicate that the simulation operations of the ready-for-execution instruction 132 has been completed. Therefore, if another ready-for-execution instruction 132 is determined as an extended instruction in the future, the emulation flag EF will be re-asserted for the sake of calling the simulation module 122 again, which will activate associated conversion and execution operations of the simulation program corresponding to the extended instruction.

In an embodiment, the interrupt service program used to call the simulation module 122 (that is, the aforementioned specialized #UD interrupt service program or the self-defined interrupt service program #NE) may be programmed as microcode and stored in a microcode memory 450 and may be accessed by a microcode control unit 460 (which may be implemented by a state machine and a combination logic circuit). In another embodiment, the operations of calling the specialized/self-defined interrupt service program may be independently constructed as an interrupt control unit or module (for example, an interrupt control unit under an RISC/RISC-V architecture); in yet another embodiment, the specialized/self-defined interrupt service program may be called through the address indicated by associated microcode stored in the microcode memory 450. In yet another embodiment, an interrupt pre-processing unit (for example, the microcode control unit 460 is constructed as an interrupt pre-processing unit, or the interrupt control unit under the RISC/RISC-V architecture is modified as an interrupt pre-processing unit) may be used to invoke a corresponding interrupt service program to call the simulation module 122 when a NOP instruction corresponding to the ready-for-execution instruction 132 (currently an extended instruction) is retired. In one embodiment, the interrupt pre-processing unit may be microcode stored in a ROM (Read Only Memory) or codes programmed by PLA (Programmable Logic Array). In an embodiment, a system call of requesting the operating system 120 to activate the simulation module 122 may be applied by means of interrupts as aforementioned. Specifically, the simulation module 122 may be programmed as a callback function and the ready-for-execution instruction 132 (or only its format information) may be sent as parameters to this callback function. And, after this programmed callback function implements the conversions and executions of the simulation program corresponding to the ready-for-execution instruction 132, this callback function may store associated execution result in the simulation-execution-result store region 1246 and then inform the processor 110 of retrieving the stored execution result therefrom. In one embodiment, the simulation module 122 may be called through an internal interrupt or a trap. Specifically, the processor 110 designer may define an interrupt vector #NE to invoke a system call so as to enter a kernel mode of the operating system 120 to invoke the simulation module 122. Implementations of such technologies are well-known by those skilled persons and will not be repeated herein. In yet another embodiment, each instruction entry of the reordering buffer 440 further includes an emulation flag field (not shown) configured to store the emulation flag EF associated with each microinstruction. In this embodiment, if a ready-for-execution instruction 132 is an extended instruction such that the microinstruction-sequence calling unit 1124 fails to interpret/recognize it and thus causes an associated NOP operation. Simultaneously, the monitor 114 determines that this ready-for-execution instruction 132 is an extended instruction (and may be simulated by the processor 110) and then asserts the emulation flag EF, which is sent to the renaming unit 1602 and the reordering buffer 440 accompanied with this NOP instruction. Accordingly, when the instruction retire unit 4402 of the reordering buffer 440 retires this NOP instruction, the instruction retire unit 4402 checks to find that the emulation flag EF accompanied with this NOP instruction is asserted (without accessing the private register 116D), thereby invoking associated interrupt service program to call the simulation module 122 to convert the ready-for-execution instruction 132 (also an extended instruction) into a simulation program and then execute it thereafter. It is to be noted that if the emulation flag EF accompanied with this NOP instruction is not asserted, the instruction retire unit 4402 will invoke the conventional interrupt service program regarding the interrupt vector #UD to process the invalid opcode/instruction exception. This conventional exception manipulations are well-known by the skilled persons such that related description are not repeated herein.

In an embodiment, the processor 110 may further include a conversion cache 280, configured to couple with the microinstruction-sequence calling unit 1124 and the monitor 114, to store the microinstruction sequence of the simulation program sent from the microinstruction-sequence calling unit 1124 when the emulation flag EF is set (for example, the value thereof is set to 1). The stored microinstruction sequence may be directly retrieved from the conversion cache 280 for the following uses if the same extended instruction is encountered in the future, which indicates the same conversion/simulation operations for this extended instruction are unnecessary to repeat again. That is, if an ready-for-execution instruction 132 is determined as an extended instruction and the microinstruction sequence of the simulation program relative to this extended instruction has been stored in the conversion cache 280, the required microinstruction sequence may be accessed from the conversion cache 280 and then a clear signal may be asserted to inform the private register 116D of clearing/invalidating the emulation flag EF and the ready-for-execution instruction 132 stored in the current private register 116D, which means that it is unnecessary to call the simulation module 122 and repeat conversion/simulation operations again. In an embodiment, in order to facilitate the identification of an extended instruction corresponding to each simulation program, the instruction format information (for example, PRE/EOP/MOP/ODI) of the extended instruction may be used as the tag for indexing associated simulation program. Therefore, when the emulation flag EF is 1 (i.e., asserted), the instruction format information (for example, PRE/EOP/MOP/ODI) of the extended instruction may be used as comparisons with those tags of the conversion cache 280, and the microinstruction sequence whose tag hits with the instruction format information will be retrieved. It is to be noted that the contents of the microinstruction sequence stored in the conversion cache 280 are authorized to be accessed/modified only when the emulation flag EF is asserted, so that the values thereof remains unchanged when the emulation flag EF is not asserted. Specifically, the microinstruction sequences stored in the conversion cache 280 will be prevented from being cleared, reset, overwritten, or modified when the processor 110 switches current context to execute other programs. Accordingly, if the processor 110 encounters the same extended instruction which may need to repeat the same simulation operations again, the processor 110 may retrieve the required microinstruction sequence from the conversion cache 280 instead of calling the simulation module 122 to perform conversion/simulation operations. In another embodiment, the conversion cache 280 may be embodied in an uncore region (e.g., L3-cache) of a multiple-core processor, so that the simulation program stored therein may be shared by all processor cores. Please note that the simulation program stored in the uncore region of the multi-core processor should be macroinstructions, such that a processor core requiring simulation operations for its current ready-for-execution instruction (which is an extended instruction now) may access and decode associated simulation program from the uncore region to generate required microinstruction sequence, which is then directed to a subsequent pipeline circuitry (e.g., the executor 160) within this processor core for executions.

Figure 4B:
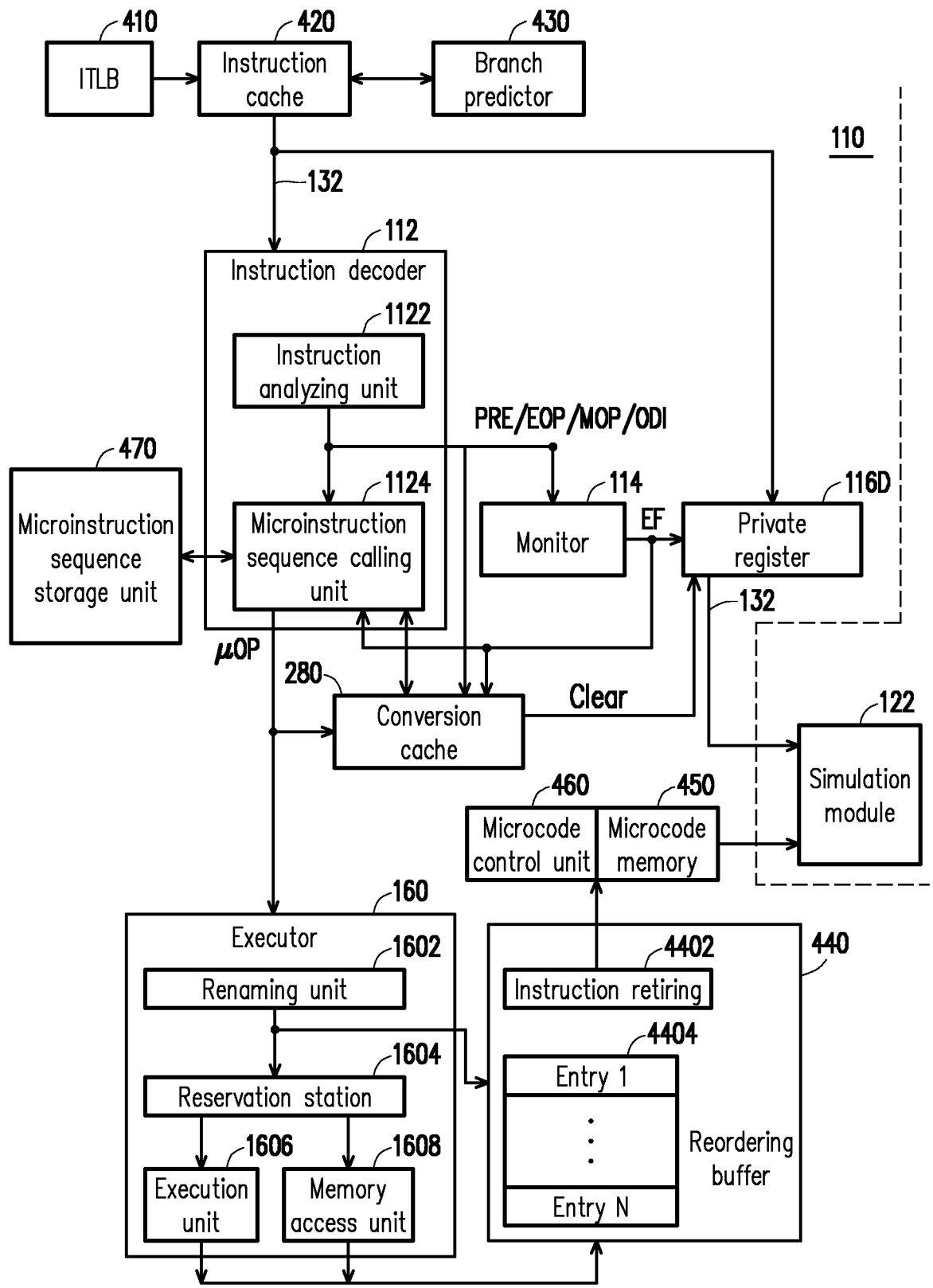
FIG. 4B is a detailed structure diagram of a processor in an electronic device according to another embodiment of the disclosure.

In an embodiment, in the processor 110 shown in FIG. 4B, the microinstruction sequence and the value of emulation flag EF in the conversion cache 280 are provided to the microinstruction-sequence calling unit 1124 for references. Under the structure of the processor 110 in FIG. 4B, when the current ready-for-execution instruction 132 is an extended instruction which has been simulated in the past, associated microinstruction sequence for simulating this extended instruction is stored in the conversion cache 280. Specifically, if the extended instruction becomes the current ready-for-execution instruction 132 again, the microinstruction-sequence calling unit 1124 of instruction decoder 112 still cannot recognize the ready-for-execution instruction 132 correctly (thereby causing a NOP instruction), but on the other hand, the monitor 114 may also determine this ready-for-execution instruction 132 as an extended instruction and thus assert the emulation flag EF. Thereafter, the microinstruction-sequence calling unit 1124 checks and finds that the emulation flag EF is set because of the failure of inaccurately decoding current ready-for-execution instruction 132, and then query the conversion cache 280 for the provision of required microinstruction sequence. After the microinstruction-sequence calling unit 1124 receives needed microinstruction sequence corresponding to the extended instruction from the conversion cache 280, the microinstruction-sequence calling unit 1124 may incorporate associated operand information of the ready-for-execution instruction 132 (e.g., this operand information may be the way of addressing operands indicated by the current ready-for-execution instruction 132 since the operands of the current extended instruction may be different from the previously stored ones) with the stored microinstruction sequence, so as to generate required microinstruction sequence corresponding to the current ready-for-execution instruction. The generated microinstruction sequence is forwarded to the executor 160 and then the emulation flag EF as well as the register(s) for caching the extended instruction in the private register 116D will be cleared/invalidated. Alternatively, if the emulation flag EF is asserted but the microinstruction-sequence calling unit 1124 does not find the required microinstruction sequence relative to current extended instruction within the conversion cache 280, a NOP instruction will be derived and sent to the renaming unit 1602. Accordingly, when this NOP instruction is retired, the extended instruction is converted and simulated by means of associated interrupt service program as aforementioned (e.g., #UD or #NE). The operation described above has been illustrated in previous sections and will not be repeated herein.

It is to be noted that, since the formats as well as definitions of the extended instructions are accessible in public and well-known by the skilled persons, the processor 110 designers may analyze the formats/definitions of the extended instruction and then design their own instruction analyzing unit 1122 by means of combination logic circuit or other similar designs for extended instruction determinations. The disclosure is not limited in this respect.

In an embodiment, the instruction analyzing unit 1122 within the instruction decoder 112 in FIG. 4A or FIG. 4B may be duplicated in the monitor 114, which also receives the ready-for-execution instruction 132 and specifically determines whether this ready-for-execution instruction 132 is an extended instruction or not. Under this structure, the processor 110 designer may separate the instruction decoder 112 and the monitor 114 as two independent modules within their processor 110 (and receive the ready-for-execution instruction 132 together).

Figure 5A:
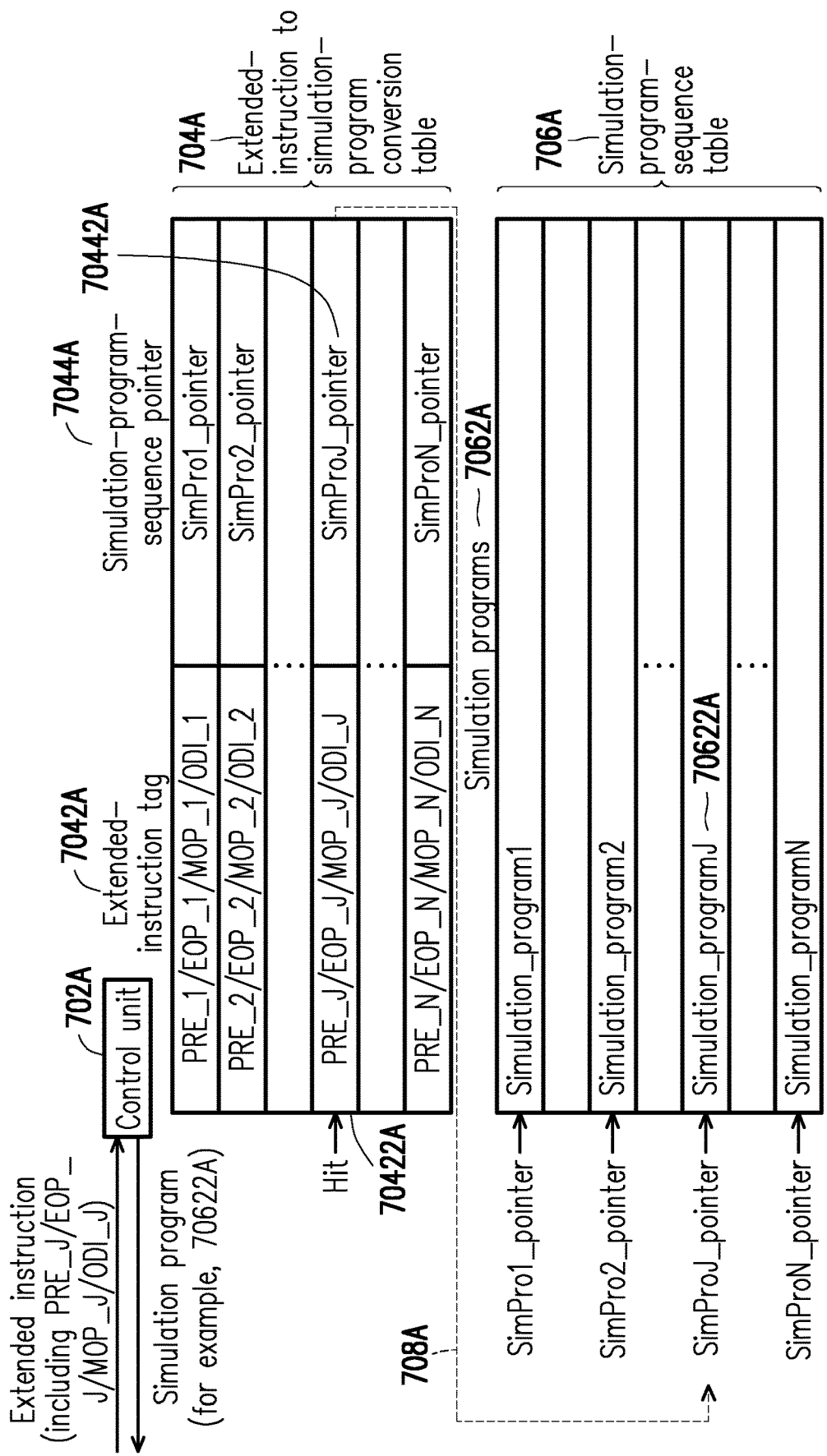
FIG. 5A is a schematic diagram of a simulation module used for translating an extended instruction according to an embodiment of the disclosure.

Next, FIG. 5A illustrates an exemplarily schematic diagram showing how the simulation module 122 converts an extended instruction. The simulation module 122 in FIG. 5A includes a control unit 702A, an extended-instruction to simulation-program conversion table 704A, and a simulation-program-sequence table 706A (that is, the simulation program table described above). The control unit 702A is responsible for the conversion operations of the simulation module 122 on the extended instruction (a ready-for-execution instruction 132, currently) to access a simulation program corresponding to the extended instruction. Those operations will be described in detail later. The extended-instruction to simulation-program conversion table 704A includes two sections: an extended-instruction tag 7042A and a simulation-program-sequence pointer 7044A, which are respectively configured to store the format information of the extended instruction and the address indicating where the simulation program associated with the extended instruction is stored in the simulation-program-sequence table 706A. The simulation-program-sequence table 706A stores simulation programs 7062A (which are programed by means of compatible instructions of the processor 110 in advance) of all the extended instructions, and is traversed through the simulation-program-sequence pointer 7044A. In an embodiment, the processor 110 designer may program each extended instruction (which is under an extended or new instruction set) as associated compatible instruction sequence by using compatible instructions (such as the native instructions) of the processor 110 beforehand. Each of these pre-prepared/pre-programmed compatible instruction sequence is then compiled as associated simulation program 7062A and stored in the simulation-program-sequence table 706A. Therefore, if the current ready-for-execution instruction 132 is an extended instruction having pre-programmed simulation program(s), relative simulation program may be found and accessed through the structure shown in FIG. 5A to generate a simulation execution result for the current one.

The control unit 702A may compare the format information of the extended instruction, including PRE, EOP, MOP, and ODI (as aforementioned, ODI includes information within an extended instruction required for instruction decoding/interpretations) with the extended-instruction tag 7042A in the extended-instruction to simulation-program conversion table 704A. If a match is found (that is, the format information of the extended instruction hit with one of the extended-instruction tags 7042A), the control unit 702A traverses the simulation-program-sequence table 706A and then accesses required simulation program along the indication of the simulation-program-sequence pointer 7044A appended with the extended-instruction tag 7042A. Assume the format information of the ready-for-execution instruction 132 sent from the processor 110 are PRE_J/EOP_J/MOP_J/ODI_J (J is a positive integer between 1 and N), the control unit 702A compares each extended instruction tag 7042A with the PRE_J/EOP_J/MOP_J/ODI_J. As shown in FIG. 5A, the format information PRE_J/EOP_J/MOP_J/ODI_J has been stored in the extended-instruction to simulation-program conversion table 704A, such that a "hit" occurs at the tag indicated by 70422A and the simulation-program-sequence pointer 70442A (that is, SimProJ_Pointer) may be accessed and then employed to look for required simulation program from the simulation-program-sequence table 706A. The simulation program 70622A (that is, Simulation_ProgramJ indicated by SimProJ_Pointer in FIG. 5A) is then found along the indication of a dashed-line arrow 708A, and the conversion processes for the extended instruction is completed after the control unit 702A retrieves required simulation program (i.e., Simulation_ProgramJ). Thereafter, the simulation module 122 may execute the simulation program Simulation_ProgramJ to generate and then forward required execution result (for simulating the implementations of extended instruction whose format information is PRE_J/EOP_J/MOP_J/ODI_J) to the processor 110. The executions of the simulation program will be explained later with the references of the exemplary program shown in FIGS. 6A and 6B collectively.

In an embodiment, in addition to the extended instruction (or the format information of the extended instruction, which is only portions of the extended instruction), the processor 110 may further forward more additional information to the simulation module 122, such as the context-state information which the processor 110 is currently running as well as associated context limitation(s) in implementing the current extended instruction, so as to determine whether the current extended instruction can be executed under the current context of the processor 110. For example, if the control unit 702A determines that the extended instruction cannot (or is not suitable to) be performed in current context of the processor 110 (e.g., the extended instruction may be performed in protected mode but the processor is in real mode now), it may thus invoke corresponding interrupt service program to notify the operating system 120/the application program 130 of this interpretation/execution exception. In another embodiment, the simulation module 122 may carry out the comparisons by using a part of the extended instruction only, for example, PRE/EOP/MOP, to obtain required simulation program.

It is to be noted that in an embodiment, those codes stored in the extended-instruction tag 7042A of the extended-instruction to simulation-program conversion table 704A may be derived from further processing on the PRE, EOP, MOP, and ODI, such as encryption or hashing operations performed on PRE/EOP/MOP/ODI, so as to provide more protections to the conversion processes for the extended instruction. Those approaches should be well-known by those skilled in the art and will not be repeated herein. In another embodiment, the extended instructions and associated simulation programs may be added, deleted, or amended to the extended-instruction to simulation-program conversion table 704A and the simulation-program-sequence table 706A according to design needs. For example, the size of the extended-instruction to simulation-program conversion table 704A and the simulation-program-sequence table 706A may be increased through firmware updates. Assume the processor 110 designer plans to add a new extended instruction (with format information PRE_N+1/EOP_N+1/MOP_N+1/ODI_N+1) accompanied with associated simulation program Simulation_ProgramN+1 into FIG. 5A, while this simulation program Simulation_ProgramN+1 comprises an instruction sequence further consisting of M native instructions InstSeqN+1_NatInst 1, . . . , InstSeqN+1_NatInst M (M and N are both positive integers greater than 1). The aforementioned extended-instruction format information PRE_N+1/EOP_N+1/MOP_N+1/ODI_N+1, the conversion instruction sequence InstSeqN+1_NatInst 1, . . . , InstSeqN+1_NatInst M, and the simulation program Simulation_ProgramN+1 are not shown in FIG. 5A. Specifically, since there are already N extended-instruction tags in the extended-instruction to simulation-program conversion table 704A, this new-added extended instruction will be numbered as N+1 with a new extended-instruction tag 7042A by referring to its format information PRE_N+1/EOP_N+1/MOP_N+1/ODI_N+1, while a new simulation-program pointer InstSeqN+1_Pointer 7044A (not shown in FIG. 5A) is employed to indicate where the new simulation program Simulation_ProgramN+1 is located within the simulation-program-sequence table 706A (which may be stored in the store region next to that of Simulation_ProgramN). Finally, the original contents as well as all new-added information within these two tables (i.e., 704A and 704B) may be overwritten through firmware updates after the processor 110 designer accomplishes all his/her modifications. In yet another embodiment, the modifications made to the extended-instruction to simulation-program conversion table 704A and the simulation-program-sequence table 706A may be accomplished through live updates, and the disclosure is not limited in this respect.

In an embodiment, the simulation module 122 may further include an exception processing module (not shown). When an anomalous or exceptional event (for example, the simulation program does not exist, or the current converted extended instruction cannot (or is unsuitable to) be executed in current context which the processor 110 is performing) occurs during the conversion processes of the simulation module 122, this exception processing module may generate and notify an abnormality/exception result of the application program 130 and the operating system 120 so as to activate corresponding remedial steps to prevent the electronic device 100 from crashing/damaging by this anomalous/exceptional event. For example, the abnormality/exception result may be an asserted flag (or a notification by writing a specific register) indicative of an exception occurrence, which is then returned to the application program 130 for further processing. In another embodiment, the application program 130 or the operating system 120 may skip the instruction causing this abnormality/exception instruction, or display that the function indicated by this instruction cannot be implemented, or report an error.

Figure 5B:
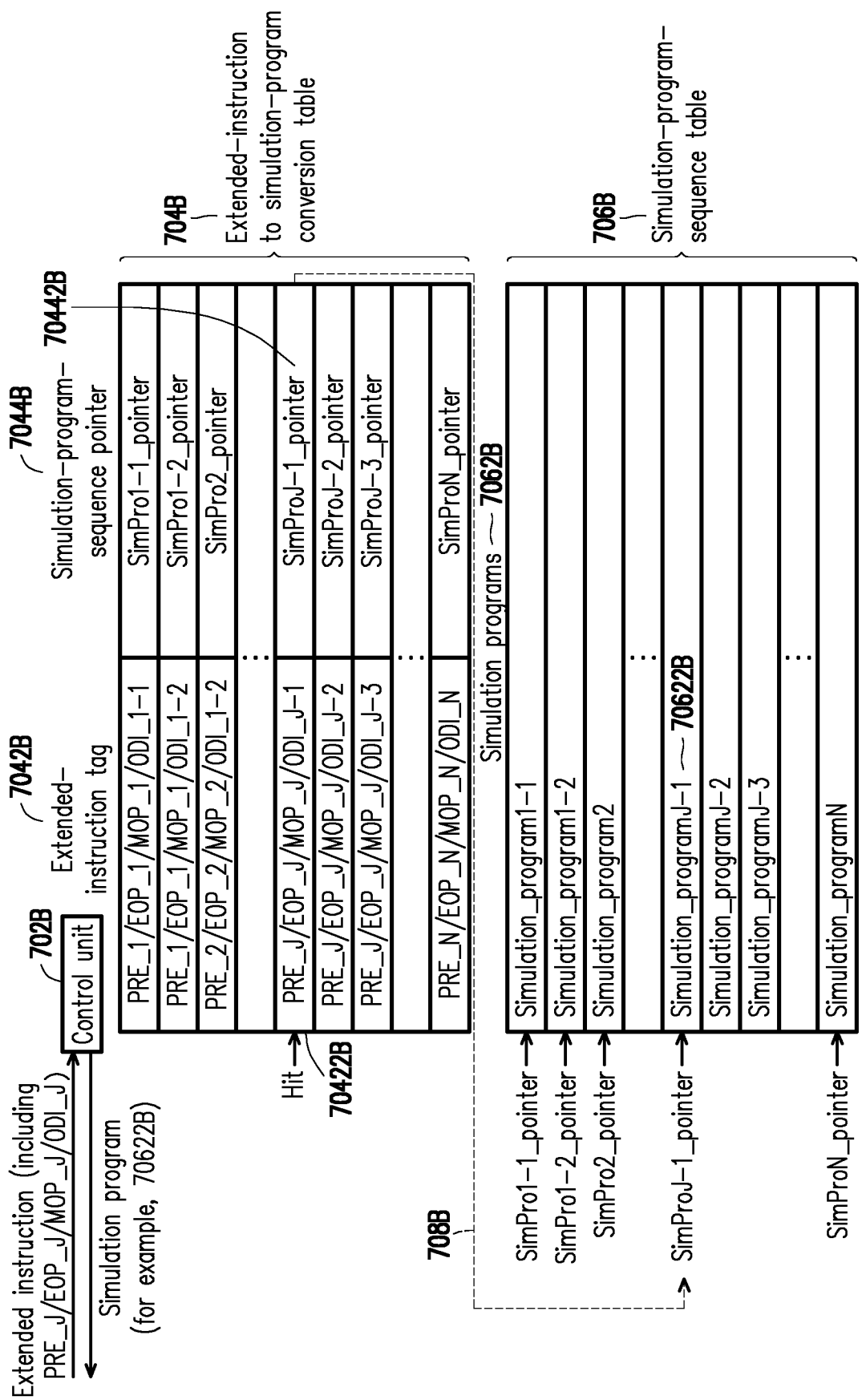
FIG. 5B is a schematic diagram of a simulation module used for translating an extended instruction according to another embodiment of the disclosure.

Next, FIG. 5B shows a schematic diagram of the simulation module 122 according to another embodiment for translating an extended instruction. Similar to the embodiment of FIG. 5A, the simulation module 122 in FIG. 5B also includes a control unit 702B, an extended-instruction to simulation-program conversion table 704B, and a simulation-program-sequence table 706B. The control unit 702B is responsible for the conversion operations of the simulation module 122 on the extended instruction to obtain a simulation program corresponding to the extended instruction (that is, the ready-for-execution instruction 132). The extended-instruction to simulation-program conversion table 704B includes two sections: an extended-instruction tag 7042B and a simulation-program-sequence pointer 7044B, which are respectively configured to store the format information of the extended instruction and the address indicating where the simulation program corresponding to the extended instruction is stored in the simulation-program-sequence table 706B. The simulation-program-sequence table 706B stores simulation programs 7062B of all the extended instructions, and is accessed through the simulation-program-sequence pointer 7044B. The simulation-program-sequence table 706B stores simulation programs 7062B (which are programed by means of compatible instructions of the processor 110 in advance) of all the extended instructions, and is traversed through the simulation-program-sequence pointer 7044B. In yet another embodiment, any modification made to the extended-instruction to simulation-program conversion table 704B and the simulation-program-sequence table 706B may also be implemented by live updates and the disclosure is not limited in this respect.

The embodiment of FIG. 5B allows an extended instruction to map with more than one simulation programs, which is different from that of FIG. 5A. For example, assume the format information PRE/EOP/MOP/ODI of the ready-for-execution instruction 132 is PRE_J/EOP_J/MOP_J/ODI_J, which may correspond to three extended-instruction tags and simulation-program pointers in the extended-instruction to simulation-program conversion table 704A, such as those three extended-instruction tags PRE_J/EOP_J/MOP_J/ODI_J-1, PRE_J/EOP_J/MOP_J/ODI_J-2, and PRE_J/EOP_J/MOP_J/ODI_J-3 in FIG. 5B and their associated simulation-program pointers SimProJ-1_Pointer, SimProJ-2_Pointer, and SimProJ-3_Pointer, respectively. This is because, for example, an extended instruction may support operands with different sizes, while relative instruction sequences regarding this extended instruction may include determinations or iterations, which may arise at least one branches and/or iteration loops during executions and thus affect the performances of the processor 110. Therefore, it may be advantageous for the processor 110 designer to upgrade their processor performances by evaluating/analyzing operand sizes in advance and then create instruction sequences capable of reducing or avoiding possible branches/iterations within instruction flows of processor pipelines. For example, if the extended-instruction tags PRE_J/EOP_J/MOP_J/ODI_J-1, PRE_J/EOP_J/MOP_J/ODI_J-2, and PRE_J/EOP_J/MOP_J/ODI_J-3 respectively correspond to an extended instruction with 128-bit, 256-bit, and 512-bit operands, the control unit 702B may analyze the format information (for example, ODI) of the extended instruction and then learn the operand size of the current extended instruction before accessing required simulation program (e.g., the simulation program associated with PRE_J/EOP_J/MOP_J/ODI_J-3 is accessed if the maximum size 512-bit operand is used). The performances of the required simulation programs may be upgraded because relatively efficient simulation program is accessed for implementations. It is noted that the above examples are for illustrative purposes only, and those skilled in the art should know that any approach other than the operand-size determinations may be applied to separate independent simulation programs required by an extended instruction, and the disclosure is not limited in this respect.

Referring back to FIG. 5B to demonstrate the following operations of the embodiments. The control unit 702B may compare the format information of the extended instruction, including PRE, EOP, MOP, and ODI (which is required for instruction interpretations as aforementioned) with the extended-instruction tag 7042B in the extended-instruction to simulation-program conversion table 704B. If a match is found (that is, the format information of current extended instruction hits with one of the extended instruction tags 7042B), the control unit 702B traverses the simulation-program-sequence table 706B to retrieve required simulation program 7062B according to the indication of simulation-program-sequence pointer 7044B appended with the extended-instruction tag 7042B. For example, if PRE/EOP/MOP/ODI of the ready-for-execution instruction 132 directed from the processor 110 is PRE_J/EOP_J/MOP_J/ODI_J (J is a positive integer between 1 and N) and the control unit 702B finds that PRE_J/EOP_J/MOP_J/ODI_J should be PRE_J/EOP_J/MOP_J/ODI_J−1 after analyzing PRE_J/EOP_J/MOP_J/ODI_J (for example, after analyzing the operand size of this extended instruction), the match will be found during comparisons with PRE_J/EOP_J/MOP_J/ODI_J−1 of the extended-instruction to simulation-program conversion table 704B (as shown by a reference number 70422B). Thereafter, the control unit 702B obtains associated simulation-program-sequence pointer 70442B from the extended-instruction to simulation-program conversion table 704B according to the extended instruction tag 70422B (that is, SimProJ−1_Pointer), and then employs the address indicated by the simulation-program-sequence pointer 70442B to traverse the simulation-program-sequence table 706B for required simulation program. The simulation program 70622B, which is also Simulation_ProgramJ−1 in FIG. 5B, is found along a dashed line arrow 708B indicated by the simulation-program-sequence pointer 70442B. Finally, after the control unit 702B retrieves the simulation program (the Simulation_ProgramJ−1 indicated by the simulation-program-sequence pointer 70442B), the simulation module 122 executes this simulation program Simulation_ProgramJ−1 to generate and provide an execution result to the processor 110.

In an embodiment, in addition to the extended instruction (or the format information of the extended instruction, which is only portions of the extended instruction), the processor 110 may further deliver more additional information to the control unit 702B, such as the context-state information of the context which the processor 110 is running currently as well as associated context limitation(s) for performing the extended instruction, so as to determine whether the extended instruction can be executed under the current context of the processor 110. The above operations are the same as that of FIG. 5A and will not be repeated again. In an embodiment, those codes stored in the extended-instruction tag 7042B of the extended-instruction to simulation-program conversion table 704B may be derivatives from further processing on the PRE, EOP, MOP, and ODI, such as encryption or hashing operations performed on PRE/EOP/MOP/ODI, so as to provide more protections to the conversion processes for the extended instruction. Those approaches should be well-known to the skilled persons and will not be repeated again. In yet another embodiment, extended instructions and associated simulation programs may be added, deleted, or updated to the extended-instruction to simulation-program conversion table 704B and the simulation-program-sequence table 706B according to needs, which is the same as that of FIG. 5A and will not be repeated again.

Please note that regardless of the conversion operations on the extended instruction in FIG. 5A or 5B, associated temporary information (for example, the temporary information derived from the comparison processes on the extended instruction tags 7042A/7042B, all the tables and pointers shown in FIG. 5A or 5B, and/or those program codes required for the implementations of the control units 702A/702B) generated in operations may be stored in the conversion-information store region 1244 of the main storage through an address indicated by the conversion-information pointer register 116B. The accessed simulation program may also be temporarily stored in the conversion-information store region 1244 and wait for executions by the processor 110 (e.g., transferring the simulation-program-sequence pointer (such as SimProJ−1_Pointer) to the processor 110 for accessing and implementations). In one embodiment, the processor 110 designer may mark all the simulation programs that have been accessed or may log/record the accessed count/frequency for each of the simulation program as references for the simulation module 122 or for the consecutive processor designs.

In another embodiment, the conversion operations of FIGS. 5A and 5B may be implemented by an independent conversion module (not shown), which may be embedded within the simulation module 122 or as a callback function invoked by the simulation module 122 (such as the system call), such that the processor 110 may store associated contents of state registers before the processor 110 switches context to perform this independent conversion module. Based on this requirement, a state stack (not shown) may be allocated in the processor-current-state store region 1242 for the uses of storing current context information of the processor 110. For example, the current context/operation information of the processor 110 is pushed to store in a first layer of the state stack when the processor 110 invokes the simulation module 122. Subsequently, when the simulation module 122 calls the conversion module, the simulation module 122 pushes context/operation parameters used by current context to be stored in the second layer of the state stack (may be allocated right above the first layer) and then switches context for the conversion module to perform conversion operations on the extended instruction. Thereafter, when the conversion module accomplishes conversion operations for the extended instruction and obtains corresponding simulation program successfully, the processor 110 restores/resumes the context before calling the conversion module by popping the pre-stored context/operation parameters from the second layer of the state stack and then performs context resuming operations. Finally, after the simulation module 122 executes the simulation program relative to the extended instruction, the simulation module 122 may pop the context/operation parameters stored in the first layer of the state stack and resume the context at the moment calling the simulation module 122. Although the disclosure stores context information in stacks, those skilled in the art should know that any approach configured to store the context/operation parameters is an equivalent substitution without departing from the spirits of the disclosure, and should be included in the appended claims of the disclosure.

Finally, when the simulation module 122 executes the simulation program, all temporary information generated in the simulation processes, including data structures and variables defined by the simulation program as well as temporary data derived within the execution processes, etc., may be stored into the simulation-execution-result store region 1246 indicated by the simulation-execution-result pointer register 116C. The execution result of the simulation program may also be reserved/remained in the simulation-execution-result store region 1246 as references for the processor 110 or subsequent extended instruction(s). The purpose of reserving previous execution result is, for example, if the application program 130 forwards continuous extended instructions to the processor 110 and those extended instructions have (data) dependency upon executions, the execution result(s) of the previous extended instruction(s) may be maintained for the reference(s) of subsequent extended instruction(s), thereby improving the simulation performance(s) of the (consecutive) extended instruction(s). It is noted that since the processor-current-state store region 1242, the conversion-information store region 1244, and the simulation-execution-result store region 1246 within the store region 124 may be accessed during the period when the simulation module 122 is called (that is, the period when the real-time simulation mode is turned on), all the information stored in the store region 124 may be freely accessible by the simulation module 122. Those skilled in the art may make any adjustment based on their applications but the disclosure is not limited in this respect. In an embodiment, the processor 110 designer may program/compile an independent execution module (not shown) separated from the simulation program to implement the aforementioned simulation operations, which is then invoked to execute simulation operations by the simulation program. The skilled persons are familiar with those operations in editing/programming/compiling an execution module and will not be described in detail herein.

FIGS. 6A, 6B and 6C collectively show an exemplary simulation program corresponding to a VADDSD instruction under the AVX-512 instruction set (AVX is the abbreviation of Advanced Vector Extensions). As aforementioned, this VADDSD instruction may be unrecognizable by the instruction decoder 112 (thereby arising a NOP instruction) but may be recognizable by the monitor 114, such that the monitor 114 asserts the emulation flag EF and subsequently to invoke the simulation module 122 by means of related interrupt service program (which is related to #UD or #NE invoked by the retirement of the NOP instruction) accompanied with the VADDSD instruction as a parameter. The instruction format of the VADDSD in AVX-512 specification is:

VADDSD XMM0 {K1} {Z}, XMM1, XMM2

The operations defined by VADDSD is: add the low double-precision floating-point value from XMM2 to XMM1 and store the result in XMM0. In addition, VADDSD further supports a masking operation, which executes the above addition when {K1}=1 (K1 is the second bit in an 8-bit masking register, that is, bit 1 in bit 0~bit 7). {Z} is configured to determine whether a final result should be zeroing-masking or merging-masking with the original one. Please refer to the AVX-512 spec for additional definitions/demonstrations for VADDSD, and the disclosure will not repeat them herein.

Basic information of the simulation program simulate_addsd_512 in FIGS. 6A, 6B and 6C is illustrated as follows:

(1) Inst: a data structure that includes all information decoded and obtained from machine codes (for example, obtained from the ready-for-execution instruction 132 which is determined as an extended instruction), in which:
 a. dst: a target register obtained by decoding the ready-for-execution instruction;
 b. src *: a plurality of source registers obtained by decoding the ready-for-execution instruction;
 c. evex.b: the operation mode indicated by the current instruction;
(2) max_vl: the maximum size of the current vector register. For the AVX-512 specification, max_vl=512;

(3) ProcessorContext: the machine state reserved by the processor when an interrupt (for example, #NE interrupt) occurs;
(4) DedicateHW: the hardware resource provided by the dedicated hardware 116 for the uses of the data structure during simulation operations.

The contents as well as meanings of the exemplary program codes of FIGS. 6A/6B/6C are shown as follows:
(1) Lines 3-6: Initialize store regions required for simulation operations;
(2) Lines 7-12: Determine if the dedicated hardware 116 supports the current target register dst which needs simulations (instructed by DedicatedHW). If the current target register dst does not exist in the dedicated hardware 116 (which indicates the processor 110 hardware supports this target register), associated data will be accessed from the processor-current-state store region 1242 according to the indication of $ctx (instructed by ProcessorContext);
(3) Lines 14-25: Read the source operands (represented by src1/src2, respectively). The way of obtaining these source operands is the same as that of obtaining the aforementioned target register (i.e., dst). The simulation program firstly determines if the source operands are existent ones in the dedicated hardware 116 (i.e., supported by the dedicated hardware 116). If the source operands are nonexistent in the dedicated hardware 116, which means the processor 110 supports the registers, such that the source operands are accessed from the processor-current-state store region 1242 by means of *ctx (indicated by ProcessorContext);
(4) Lines 27-49: program codes written according to the VADDSD operations defined by the AVX-512 specification, for example:
 a. Line 27: Recognize the operation mode (Broadcast/RC/SAE context) indicated by the current instruction, and activate a static rounding control on the operands according to the specification when evex.b is 1;
 b. Lines 34-49: Determine whether the current VADDSD instruction is controlled by a masking register. For example, src1+src2 is executed when k1{0}=1, but no operation is performed otherwise;
 c. The final result is determined based on {Z}. For example, a zeroing-masking operation is performed if {z}=1, while a merging-masking operation is performed on the original result in the target register dst if {z}=0;
(5) Lines 51-56: Determine whether the target register dst is supported by the processor 110 (for example, a 512-bit register is not supported by the processor 110 if the maximum register size of the processor 110 is 256-bit). When the dst register is not supported by the processor 110, those simulation registers (allocated in the simulation register file 116E) provided by the processor 110 for simulating non-supported registers are used to simulate the dst register, and associated contents corresponding to the dst register (e.g., the simulation result) are stored in the simulation registers. If the target register dst is supported by the processor 110, associated execution result is stored to the processor 110 running states of for #NE;
(6) Lines 58-60: After a maximum operand size (for example, 256) supported by the current hardware of the processor 110 is identified, all the execution results are updated to those vector registers supported by the processor 110 hardware;
(7) Line 62: Finally, return an execution result.

It is to be noted that lines 36, 48, and 49 in FIG. 6B are operations of the encoded version defined for VADDSD in the AVX-512 specification. Since the source operands of the instruction is 128-bit (XMM1) and 64-bit (XMM2), only one simulation program is required to simulate VADDSD operation. However, for those instructions supporting 512-bit source/target registers, multiple simulation programs (or may be programmed as different sections within an identical simulation program) may be required for respect 512-bit source/target registers. For example, an ADDPS (or VADDPS) instruction in the AVX-512 specification may support a 512-bit register:

ADDPS ZMM0 {k1} {z}, ZMM1, ZMM2 all ZMM0, ZMM1, and ZMM2 are 512-bit registers. According to the definitions of the AVX-512 specification, there are lots of determinations (for example, if/else) as well as for-loops required for simulations, but these determination/for-loop steps are unnecessary in the encoded versions. Specifically, the performances when the processor 110 simulates ADDPS instructions may be upgraded by referring to the encoded-version definitions such that the simulation program relative to ADDPS may be further separated into three independent ones according to operand sizes (e.g., according to 128-/256-/512-bit operands), and which one of these three is invoked depends on the largest operand size among the target/source operands of ADDPA instruction. For example, when the ready-for-execution instruction 132 is an ADDPS instruction and an operand YMM2 (which is a 256-bit operand) is identified to have the largest operand size, the processor 110 will access and perform the independent simulation program specified for 256-bit ADDPS instruction. The operations of calling relative simulation programs for VADDPD described above may be performed by using the architecture illustrated in FIG. 5B and will not be repeated herein.

Figure 7:
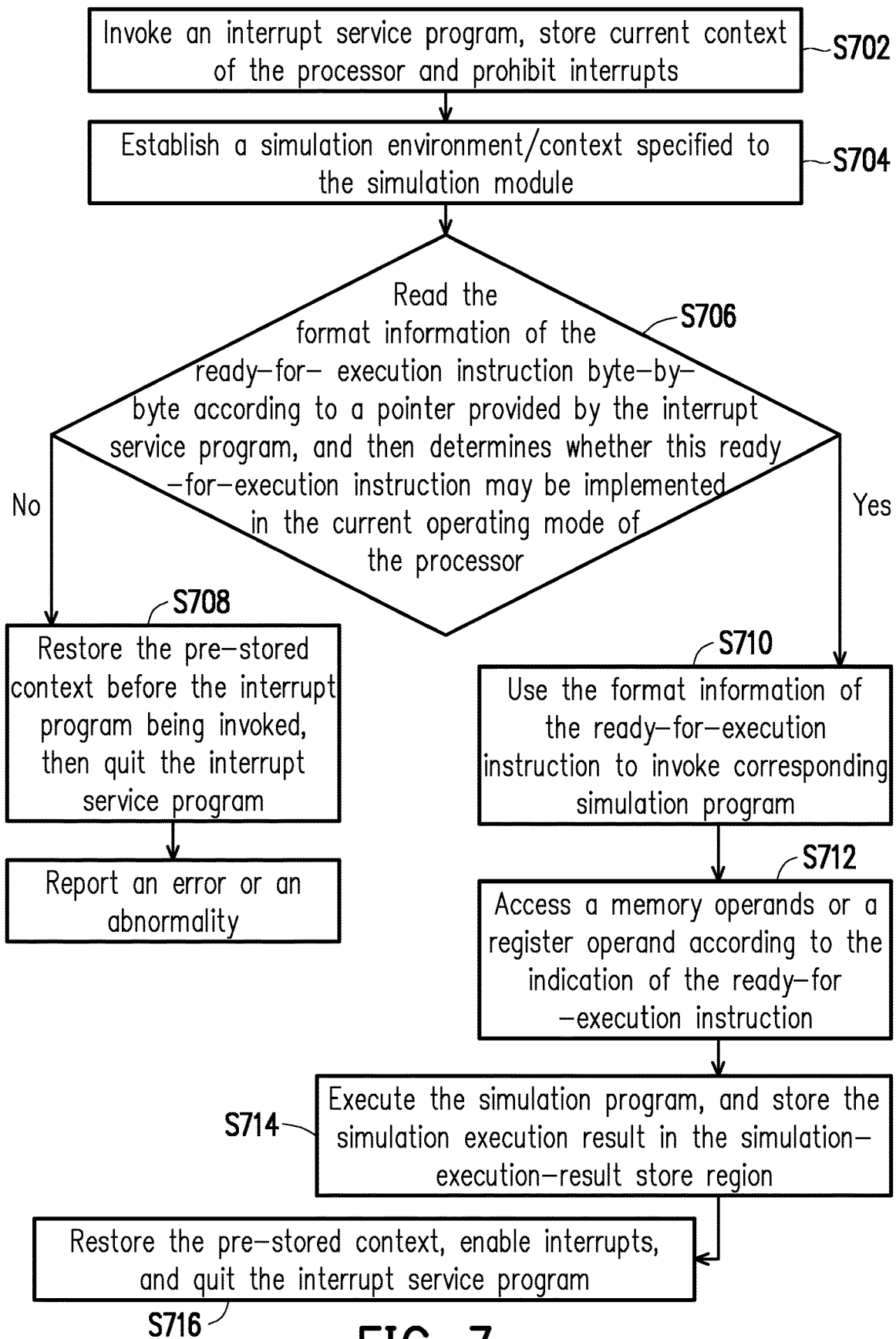
FIG. 7 is a flow chart illustrative of simulation operations according to an embodiment of the disclosure.

FIG. 7 is a flow chart of a simulation method according to an embodiment of the disclosure, which is specified for the processor shown in FIGS. 4A and 4B. As shown in FIG. 7, in step S702, when the ready-for-execution instruction 132 currently executed by the processor 110 is an extended instruction, the processor 110 hardware triggers an interrupt (e.g., #UD or #NE) and invokes a relative interrupt service program. Please refer to those descriptions in the FIGS. 4A and 4B regarding the way of invoking associated interrupt service program. At this time, other unrelated hardware interrupts are prohibited to prevent the conversion/simulation processes from being interrupted, as well as to avoid possible attack/hack to the conversion/simulation operations. In step S704, a simulation environment/context specified to the simulation module 122 is established. The parameters used for constructing a processor environment/context for the simulation module 122 may be pre-stored in the BIOS, the processor driver, or may be compiled/integrated into the kernel of the operating system, and be retrieved during establishing the environment/context for the simulation module 122. Those execution parameters associated with the current context of the processor 110 are then stored. For example, the current context-related execution parameters of the processor 110 may be stored in the processor-current-state store region 1242 (e.g., being pushed into the state stack) in the main storage through the address indicated by the processor-current-state pointer register 116A in the dedicated hardware 116. In step S706, the simulation module 122 reads the format information of the ready-for-execution instruction 132 byte-by-byte according to a pointer provided by the interrupt service program (the way of decoding and obtaining the instruction information is shown in relative descriptions of FIGS. 4A and 4B), and then determines whether this ready-for-execution instruction 132 may be implemented in the current operating mode of the processor 110. If this ready-for-execution instruction 132 is inapplicable to the current operating mode (for example, the current ready-for-execution instruction 132 (which is an extended instruction) may be executed under protected mode only, but the processor 110 works under real mode currently), the determination result at this time will be "No," and thus the flow proceeds to step S708 to restore the pre-stored context before the interrupt program being invoked. For example, the context-related execution parameters of the processor 110 previously stored in the processor-current-state store region 1242 by the simulation module 122 is now read (for example, the previously stored context-related execution parameters are popped from the state stack) from the address indicated by the processor-current-state pointer register 116A, to resume/restore the context before the processor 110 invokes the simulation module 122. Subsequently, the processor 110 then quits the simulation module 122 and terminates the conversion/simulation operations for the ready-for-execution instruction 132. If the ready-for-execution instruction 132 may be implemented in the current context of the processor 110, then the flow proceed to step S710 from step S706. After the simulation module 122 uses the format information of the ready-for-execution instruction 132 to invoke corresponding simulation program in block 710, the flow proceeds to block S712, and a memory operands or a register operand is accessed according to the indication of the ready-for-execution instruction 132. If an architectural register that is not supported by current hardware of the processor 110 is encountered, associated mappings by means of the simulation register file 116E in the dedicated hardware 116 is used for searching required operands (data is stored or modified subsequently). As described above, in the processes of calling the simulation program in step S712, all the information during the conversion processes may be stored in the conversion-information store region 1244 through the address indicated by the conversion-information pointer register 116B. In step S714, the simulation module 112 executes the simulation program. As previously described, all the information generated in the execution processes of block 714 may be stored in the simulation-execution-result store region 1246 through the address indicated by the simulation-execution-result pointer register 116C. Please note that the simulation execution result generated by the simulation program is remained in the simulation-execution-result store region 1246. In step S716, a notification regarding simulation completion is set in the simulation-execution-result store region 1246 so as to inform the processor 110 of resuming/restoring the pre-stored context (that is, the context-related execution parameters of the processor 110 pre-stored in the state stack of the processor-current-state store region 1242 before the simulation module 122 is invoked is read/obtained from the address indicated by the processor-current-state pointer register 116A). The processor 110 then quits the simulation module 122 and terminates associated simulation operations for the extended instruction. Finally, the processor 110 may use the address indicated by the simulation-execution-result pointer register 116C to read the simulation execution result of the ready-for-execution instruction 132.

Figure 8:
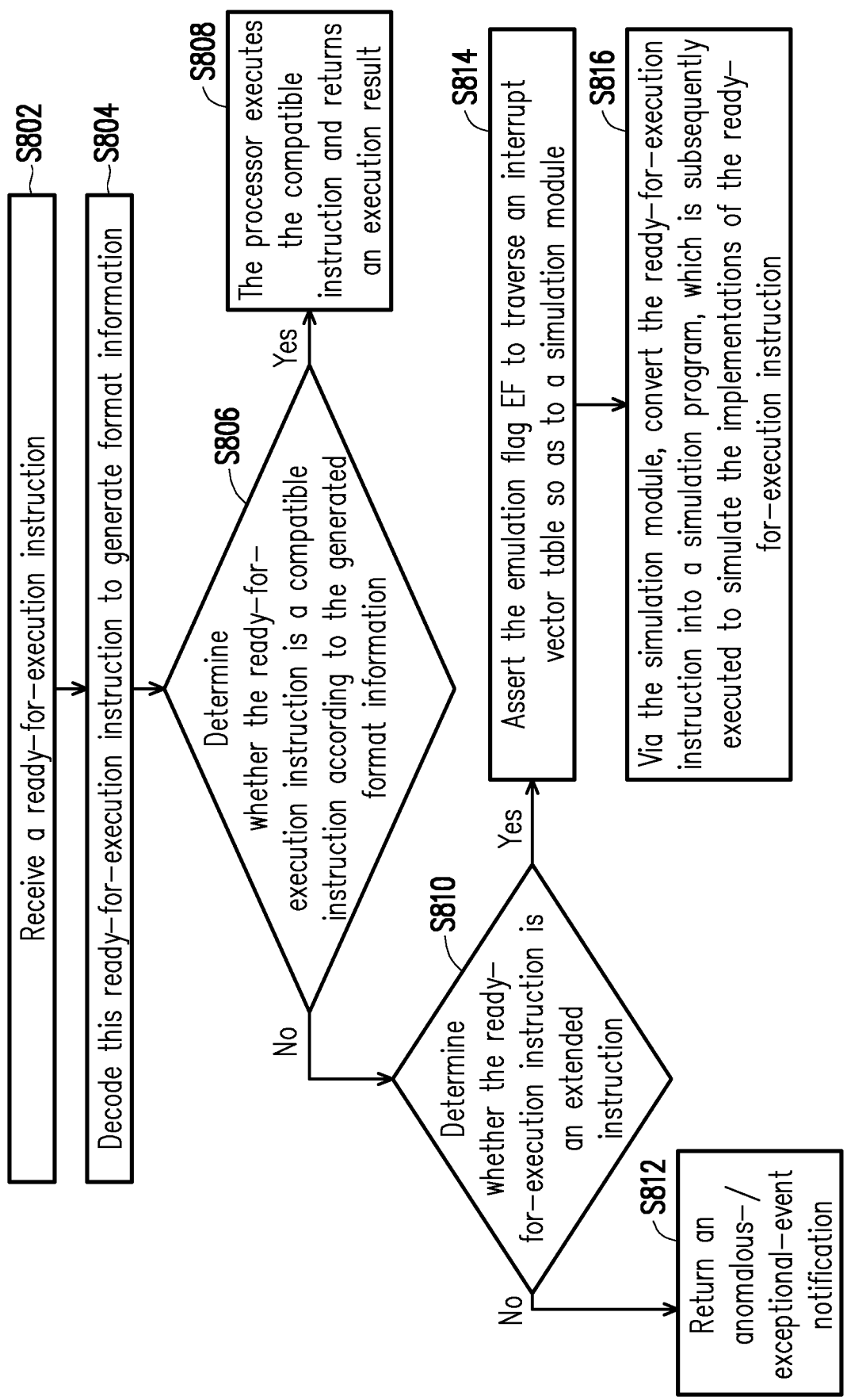
FIG. 8 is a flow chart illustrative of processing a ready-for-execution instruction according to an embodiment of the disclosure.

FIG. 8 is a flow chart illustrative of processing a ready-for-execution instruction according to the embodiment of the disclosure. As shown in FIG. 8, in step S802, the processor 110 receives a ready-for-execution instruction 132. In step S804, the processor 110 decodes this ready-for-execution instruction 132, while the instruction decoder 112 determines whether the ready-for-execution instruction 132 is a compatible instruction (for example, a native instruction) in step S806. If the ready-for-execution instruction 132 is a compatible instruction (i.e., the determination is "Yes"), the flow proceeds to step S808 and the processor 110 executes the compatible instruction and returns an execution result. If the ready-for-execution instruction 132 is not a compatible instruction (i.e., the determination of step S806 is "No"), the flow proceeds to step S810 and the monitor 114 determines whether the ready-for-execution instruction 132 is an extended instruction. If the monitor 114 determines that the ready-for-execution instruction 132 is an extended instruction (for example, the determination is "Yes"), the flow proceeds to step S814 and the monitor 114 asserts the emulation flag EF to traverse an interrupt vector table so as to look for a corresponding interrupt service program (for example, relative to #NE) when the ready-for-execution instruction 132 is retired (as shown in FIGS. 4A and 4B, a NOP instruction corresponding to the ready-for-execution instruction 132 is retired at this moment), and then the simulation module 122 may be invoked by the interrupt service program. The interrupt service program may call the simulation module 122 by using a pre-embodied hardware, a pre-programmed software, or an interface formed by a combination of software/hardware (for example, microcode executed by a microcode control unit). The simulation module 122 is called after the current ready-for-execution instruction 132 is determined as capable of calling the simulation module 122 (for example, the application program 130 has been authenticated successfully). Finally, the flow proceeds to S816 and the simulation module 122 converts the ready-for-execution instruction 132 into a simulation program, which is subsequently executed to simulate the implementations of the ready-for-execution instruction 132 (currently an extended instruction). Associated execution result is finally returned. On the other hand, the flow proceeds from step S810 to S812 if the determination in step S810 is "No", while an anomalous-/exceptional-event notification may be returned to inform the processor 110/the operating system 120 that the current ready-for-execution instruction is an incompatible one such that its execution result is unsimulatable.

In summary, the instruction simulation device and the method thereof described in the embodiments of the disclosure use a monitor to determine whether a ready-for-execution instruction derived from the application program is a compatible instruction or an extended instruction for the processor. If the ready-for-execution instruction is determined as an extended instruction, the processor converts the ready-for-execution instruction into a simulation program executable by the processor, so as to overcome the incompatibility issue among processor instruction sets, thereby extending the service life of an electronic appliance employing the disclosed simulation device therein.

The above descriptions are only exemplary embodiments of the disclosure, which are not used to limit the scope of the disclosure. Those skilled in the art may make further improvements and changes on the basis without departing from the spirit and scope of the disclosure. Therefore, the protection scope of the disclosure shall be subject to the scope defined by the claims of the disclosure.

What is claimed is:

1. An instruction simulation device, comprising a processor, the processor comprising:
    an instruction decoder, configured to generate format information of a ready-for-execution instruction; and
    a monitor, coupled to the instruction decoder, wherein the monitor is configured to determine whether the ready-for-execution instruction currently executed by the processor is a compatible instruction or an extended instruction based on the format information of the ready-for-execution instruction, wherein the compatible instruction is an instruction under a current instruction set of the processor, and the extended instruction is not an instruction under the current instruction set of the processor but is an instruction under a new instruction set or an extended instruction set, wherein the current instruction set, the new instruction set and the extended instruction set shares a same instruction set architecture (ISA) of the processor, wherein the new instruction set and the extended instruction set are instruction sets that do not belong to a native instruction set of the processor; wherein
    if the ready-for-execution instruction is an extended instruction under the new instruction set or the extended instruction set, the processor converts the ready-for-execution instruction into a simulation program corresponding to the extended instruction, and simulates an execution result of the ready-for-execution instruction by executing the simulation program; and
    if the ready-for-execution instruction is a compatible instruction, the processor executes the ready-for-execution instruction,
    wherein the simulation program is composed of at least one compatible instructions of the processor and programmed by the processor designer beforehand for simulating the execution result of the corresponding extended instruction.

2. The instruction simulation device according to claim 1, wherein a computer system embodied with the processor comprises a system memory, the system memory comprising:
    a processor-current-state store region, configured to store a current-context state of the processor;
    a conversion-information store region, configured to store temporary information in a process of translating the ready-for-execution instruction into the corresponding simulation program; and
    an execution-result store region, configured to store the execution result after executing the simulation program.

3. The instruction simulation device according to claim 1, wherein when the ready-for-execution instruction is the extended instruction, the processor asserts an emulation flag to obtain the corresponding simulation program by means of an interrupt service program.

4. The instruction simulation device according to claim 1, wherein the processor comprises:
    a plurality of registers, comprising a register configured to indicate an address of a storage space caching a current state of the processor, a register configured to indicate an address of a storage space caching a conversion intermediate result when calling the corresponding simulation program, a register configured to indicate an address of a storage space caching a simulation execution result, a simulation register configured to map a target register indicated by the extended instruction, and a register configured to cache an address indicative of a real-time conversion mode state store region.

5. The instruction simulation device according to claim 1, wherein an interrupt service program calls a simulation module to query if there is a simulation program corresponding to the extended instruction, wherein if the simulation program corresponding to the extended instruction is found, the simulation module executes the simulation program and obtains a simulation execution result for simulating the execution result of the ready-for-execution instruction.

6. The instruction simulation device according to claim 5, wherein the simulation execution result is reserved after terminating the calling to the simulation module, and when the simulation program corresponding to the extended instruction is not found, a failure result is returned to notify the processor and the calling to the simulation module is terminated in responsive to the failure result.

7. The instruction simulation device according to claim 6, wherein after terminating the calling to the simulation module, the processor reads the reserved simulation execution result or receives the failure result, wherein the processor notifies an application program arising the ready-for-execution instruction of the failure result.

8. The instruction simulation device according to claim 6, wherein if a subsequent ready-for-execution instruction is an extended instruction and the subsequent ready-for-execution instruction is converted into a simulation program corresponding to the subsequent ready-for-execution instruction, the reserved simulation execution result serves as a reference when executing the simulation program corresponding to the subsequent ready-for-execution instruction.

9. The instruction simulation device according to claim 5, wherein the simulation module is embodied in a processor driver, in a kernel of an operating system running on the processor, or stored in a basic input/output system of a computer system embodied with the processor.

10. The instruction simulation device according to claim 1, wherein the compatible instruction and the extended instruction are both instructions under an x86 instruction set architecture or a reduced instruction set computer (RISC) architecture.

11. An instruction simulation method, performed by a processor including an instruction decoder and a monitor, wherein the monitor is coupled to the instruction decoder, the instruction simulation method comprising:
using the instruction decoder of the processor to generate format information of a ready-for-execution instruction;
using the monitor of the processor to determine whether the ready-for-execution instruction currently executed by the processor is a compatible instruction or an extended instruction based on the format information of the ready-for-execution instruction, wherein the compatible instruction is an instruction under a current instruction set of the processor, and the extended instruction is not an instruction under the current instruction set of the processor, but is an instruction under a new instruction set or an extended instruction set, wherein the current instruction set, the new instruction set and the extended instruction set shares a same instruction set architecture (ISA) of the processor, wherein the new instruction set and the extended instruction set are instruction sets that do not belong to a native instruction set of the processor;
translating the ready-for-execution instruction into a simulation program corresponding to the extended instruction wherein an execution result of the ready-for-execution instruction is generated by means of a simulation execution result generated by the simulation program if the read-for-execution instruction is an extended instruction under the new instruction set or the extended instruction set; and
executing the ready-for-execution instruction by the processor if the read-for-execution instruction is a compatible instruction,
wherein the simulation program is programmed by a processor designer beforehand by means of at least one compatible instruction of the processor.

12. The instruction simulation method according to claim 11, wherein a computer system embodied the processor comprises a system memory, the system memory comprising:
a processor-current-state store region, configured to store a current context state of the processor;
a conversion-information store region, configured to store temporary information in a process of translating the ready-for-execution instruction into the corresponding simulation program; and
an execution-result store region, configured to store the simulation execution result after executing the simulation program.

13. The instruction simulation method according to claim 11, wherein when the ready-for-execution instruction is the extended instruction, the processor asserts an emulation flag to obtain the corresponding simulation program by means of an interrupt service program.

14. The instruction simulation method according to claim 11, further comprising:
calling a simulation module by an interrupt service program to read the ready-for-execution instruction;
querying whether there is the simulation program corresponding to the extended instruction by the simulation module; and
generating the simulation execution result by executing the simulation program by the simulation module when the simulation program corresponding to the extended instruction is found.

15. The instruction simulation method according to claim 14, further comprising:
reserving the simulation execution result after terminating the calling to the simulation module; and
providing a failure result by the simulation module to the processor and terminating the calling to the simulation module when the simulation program corresponding to the extended instruction is not found.

16. The instruction simulation method according to claim 15, further comprising:
reading the simulation execution result reserving by the processor after terminating the calling to the simulation module, or obtaining the failure result and notifying an application program arising the ready-for-execution instruction of the failure result.

17. The instruction simulation method according to claim 16, wherein if a subsequent ready-for-execution instruction is an extended instruction and the subsequent ready-for-execution instruction is converted into a simulation program corresponding to the subsequent ready-for-execution instruction, the reserved execution result serves as a reference when executing the simulation program of the subsequent ready-for-execution instruction.

18. The instruction simulation method according to claim 15, wherein the simulation module is embodied in a processor driver, in a kernel of an operating system running on the processor, or stored in a basic input/output system of a computer system embodied with the processor.

19. The instruction simulation method according to claim 11, wherein the compatible instruction and the extended instruction are both instructions under an x86 instruction set architecture or a reduced instruction set computer (RISC) architecture.

20. A processor instruction simulation method, comprising:

using an instruction decoder of a processor to generate format information of a ready-for-execution instruction;

using a monitor of the processor to determine whether the ready-for-execution instruction currently executed by the processor is an extended instruction based on the format information of the ready-for-execution instruction, wherein the monitor of the processor is coupled to the instruction decoder of the processor;

when the ready-for-execution instruction currently executed by the processor is the extended instruction, calling a simulation module by using an interrupt service program to obtain a simulation program corresponding to the extended instruction, wherein the extended instruction is not an instruction under a current instruction set of the processor, but is an instruction under a new instruction set or an extended instruction set, wherein the current instruction set, the new instruction set and the extended instruction set shares a same instruction set architecture as that of the processor, wherein the new instruction set and the extended instruction set are instruction sets that do not belong to a native instruction set of the processor;

prohibiting from responding to other hardware interrupts during an operation of the simulation module; and executing the simulation program to generate a simulation execution result for simulating an execution result of the ready-for-execution instruction.

21. The processor instruction simulation method according to claim 20, wherein the ready-for-execution instruction is sent as a parameter when the simulation module is called.

22. The processor instruction simulation method according to claim 21, wherein the processor executes the simulation module by means of a system call to an operating system performing on the processor.

23. The processor instruction simulation method according to claim 22, wherein the simulation module is in a kernel of the operating system or is a callback function in a driver of the processor.

24. The processor instruction simulation method according to claim 20, wherein the simulation module and the simulation program are stored in a basic input/output system of a computer system embodied with the processor, and when the computer system is turned on, the simulation module and the simulation program are loaded into a system memory of the computer system.

25. The processor instruction simulation method according to claim 20, further comprising:

terminating the calling to the simulation module after reserving a simulation execution result of the simulation program in a system memory of a computer system embodied with the processor.

26. The processor instruction simulation method according to claim 20, wherein the simulation execution result is reserved after terminating the calling to the simulation module, wherein if a subsequent ready-for-execution instruction is an extended instruction and the subsequent ready-for-execution instruction is converted into a simulation program corresponding to the subsequent ready-for-execution instruction, the reserved execution result serves as a reference when executing the simulation program of the subsequent ready-for-execution instruction.

27. The processor instruction simulation method according to claim 20, wherein the simulation program is programmed by a processor designer beforehand by using at least one compatible instruction of the processors to simulate the execution result of the extended instruction.

28. The processor instruction simulation method according to claim 20, wherein a compatible instruction and the extended instruction are both instructions under an x86 instruction set architecture, an ARM instruction set architecture, a MIPS instruction set architecture, or an RISC-V instruction set architecture.

29. A processor instruction simulation method, comprising:

using an instruction decoder of a processor to generate format information of a ready-for-execution instruction;

using a monitor of the processor to determine whether the ready-for-execution instruction currently executed by the processor is an extended instruction based on the format information of the ready-for-execution instruction, wherein the monitor of the processor is coupled to the instruction decoder of the processor;

when the ready-for-execution instruction currently executed by the processor is the extended instruction, calling an interrupt service program to obtain a simulation program corresponding to the extended instruction, wherein the extended instruction is not an instruction under a current instruction set of the processor, but is an instruction under a new instruction set or an extended instruction set, wherein the current instruction set, the new instruction set and the extended instruction set shares a same instruction set architecture (ISA) as that of the processor, wherein the new instruction set and the extended instruction set are instruction sets that do not belong to a native instruction set of the processor; and executing the simulation program to generate a simulation execution result for simulating the extended instruction, wherein any response in responsive to other hardware interrupts during obtaining and executing the simulation program is prohibited.

30. The processor instruction simulation method according to claim 29, wherein the interrupt service program obtains the simulation program corresponding to the extended instruction by means of a system call, and the ready-for-execution instruction is sent as a parameter when invoking the system call.

31. The processor instruction simulation method according to claim 30, wherein the system call invokes a simulation module in a kernel of an operating system performing on the processor or in a processor driver to obtain the simulation program.

32. The processor instruction simulation method according to claim 31, wherein the simulation module is a callback function.

33. The processor instruction simulation method according to claim 31, wherein the calling to the simulation module is terminated after the simulation module executes the simulation program to generate the simulation execution result.

34. The processor instruction simulation method according to claim 33, wherein the simulation execution result is reserved after terminating the calling to the simulation module, wherein if a subsequent ready-for-execution instruction is determined an extended instruction and the subsequent ready-for-execution instruction is converted into a simulation program corresponding to the subsequent ready-for-execution instruction, the reserved simulation execution result serves as a reference when executing the simulation program of the subsequent ready-for-execution instruction.

35. The processor instruction simulation method according to claim 29, wherein the simulation program is programmed by a processor designer beforehand by using at least one compatible instruction of the processor to simulate the execution result of the extended instruction.

36. The processor instruction simulation method according to claim 29, wherein a compatible instruction and the extended instruction are both instructions under an x86 instruction set architecture, an ARM instruction set architecture, a MIPS instruction set architecture, or an RISC-V instruction set architecture.

* * * * *